United States Patent
Kaita et al.

(10) Patent No.: US 8,229,614 B2
(45) Date of Patent: Jul. 24, 2012

(54) CONTROL SYSTEM FOR SECONDARY BATTERY, ELECTRICALLY POWERED VEHICLE HAVING SAME, AND METHOD FOR CONTROLLING SECONDARY BATTERY

(75) Inventors: Keiji Kaita, Nishikamo-gun (JP); Teruo Ishishita, Nishikamo-gun (JP); Shinobu Okayama, Nishikamo-gun (JP); Yuji Nishi, Nagoya (JP); Daisuke Kuroda, Chiryu (JP)

(73) Assignees: Toyota Jidosha Kabushiki Kaisha, Toyota (JP); Denso Corporation, Kariya-Shi (JP)

( * ) Notice: Subject to any disclaimer, the term of this patent is extended or adjusted under 35 U.S.C. 154(b) by 280 days.

(21) Appl. No.: 12/678,659

(22) PCT Filed: Sep. 25, 2008

(86) PCT No.: PCT/JP2008/067235
§ 371 (c)(1),
(2), (4) Date: Mar. 17, 2010

(87) PCT Pub. No.: WO2009/050989
PCT Pub. Date: Apr. 23, 2009

(65) Prior Publication Data
US 2010/0204861 A1    Aug. 12, 2010

(30) Foreign Application Priority Data
Oct. 15, 2007 (JP) ................................. 2007-267989

(51) Int. Cl.
*H01M 10/44* (2006.01)
*H02J 7/00* (2006.01)
*B60L 3/00* (2006.01)
(52) U.S. Cl. ........................................................ 701/22
(58) Field of Classification Search .................... 701/22; 320/133, 134; 429/435, 437, 442
See application file for complete search history.

(56) References Cited

U.S. PATENT DOCUMENTS
2006/0269807 A1* 11/2006 Fujita et al. .................... 429/26

FOREIGN PATENT DOCUMENTS
JP    A-04-301379    10/1992
JP    A-7-263031     10/1995
(Continued)

OTHER PUBLICATIONS

International Search Report for International Application No. PCT/JP2008/067235, issued Jan. 6, 2009.
Ning et al, "A Generalized Cycle Life Model of Rechargeable Li-ion Batteries," *Electrochimica Acta*, Feb. 1, 2006, pp. 2012-2022, vol. 51, No. 10, Elsevier Science Publishers, Barking, GB.

(Continued)

*Primary Examiner* — John Nguyen
*Assistant Examiner* — Rodney P King
(74) *Attorney, Agent, or Firm* — Oliff & Berridge, PLC

(57) ABSTRACT

During use of a secondary battery, a concentration change ratio estimating unit estimates a ratio of change in electrolytic solution concentration based on a charging/discharging current. According to the estimated ratio of change, a concentration estimated value calculating unit sequentially calculates an electrolytic solution concentration estimated value during the use of the secondary battery. Based on the estimated electrolytic solution concentration estimated value, a determining unit determines whether or not the electrolytic solution concentration is within a normal range. When the electrolytic solution concentration is outside the normal range, a charging/discharging condition modifying unit modifies a charging/discharging condition of the secondary battery to bring the electrolytic solution concentration back to the normal range, thus avoiding a tendency of overcharge or a tendency of overdischarge.

28 Claims, 13 Drawing Sheets

FOREIGN PATENT DOCUMENTS

| | | |
|---|---|---|
| JP | A-10-319100 | 12/1998 |
| JP | A-11-187577 | 7/1999 |
| JP | A-2000-123886 | 4/2000 |
| JP | A-2003-346919 | 12/2003 |
| JP | A-2004-31170 | 1/2004 |
| JP | A-2006-42497 | 2/2006 |
| JP | A-2007-141558 | 6/2007 |

OTHER PUBLICATIONS

Smith et al, "Control Oriented ID Electrochemical Model of Lithium Ion Battery," *Energy Conversion and Management*, Jul. 28, 2007, pp. 2565-2578, vol. 48, No. 9, Elsevier Science Publishers, Oxford, GB.

Supplementary European Search Report issued in European Patent Application No. 08840481.9 dated Jun. 27, 2011.

* cited by examiner

| TYPE | t(Win),t(Wout) | Win, Wout |
|---|---|---|
| STANDARD RATED VALUE | t1 | Win(1), Wout(1) |
| SHORT-TIME RATED VALUE (UPON RELAXATION) | t2 | Win(2), Wout(2) |
| CONTINUING RATED VALUE | t3 | Win(3), Wout(3) |

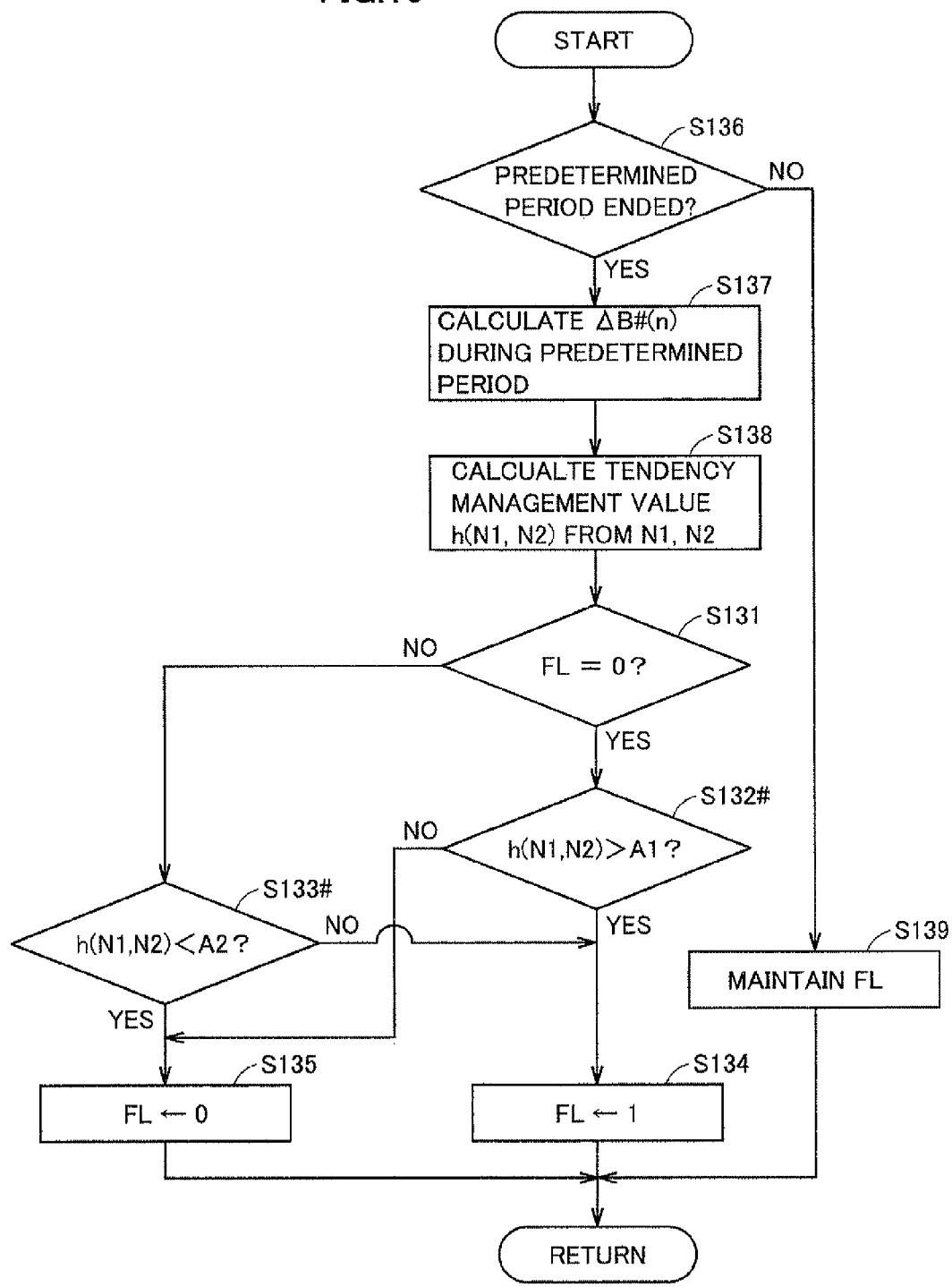

CONTROL SYSTEM FOR SECONDARY BATTERY, ELECTRICALLY POWERED VEHICLE HAVING SAME, AND METHOD FOR CONTROLLING SECONDARY BATTERY

TECHNICAL FIELD

The present invention relates to a control system for a secondary battery, an electrically powered vehicle having the control system mounted thereon, and a method for controlling a secondary battery, more particularly, to control of a battery for prevention of deterioration of its performance.

BACKGROUND ART

Power supply systems have been used which are configured so that electric power is supplied to a load by a chargeable secondary battery and the secondary battery can be charged as required even during driving of the load. Representatively, such power supply systems are mounted on hybrid cars and electric cars, each of which includes a motor driven using the secondary battery and serving as a vehicular driving force generating source.

In each of such power supply systems, electric power stored in the secondary battery is used as electric power for driving the motor serving as a driving force source, whereas the secondary battery is charged by regenerative electric power generated by the motor and electric power generated by a generator according to rotation of an engine. In such a power supply system, when the secondary battery is overdischarged or overcharged, the battery performance is deteriorated significantly, which may result in a short life thereof. Hence, generally, electric power charged/discharged to/from the secondary battery is controlled based on a battery temperature and an estimated remaining capacity (representatively, SOC: State of charge).

For example, Japanese Patent Laying-Open No. 11-187577 (Patent document 1) discloses a charging/discharging control device for preventing deterioration of a secondary battery resulting from overcharge/overdischarge, by setting a charging power upper limit value and a discharging power upper limit value to values smaller than those at a normal temperature when the battery temperature is equal to or smaller than a predetermined temperature or equal to or greater than the predetermined temperature, in order to charge/discharge with electric power appropriate for the battery's use environment and the battery's state.

Further, Japanese Patent Laying-Open No. 2004-31170 (Patent document 2) discloses a secondary battery internal resistance detecting device capable of highly accurately calculating internal resistance of a secondary battery in consideration of a degree of influence of polarization and a characteristic of a relation between current and voltage. More specifically, it is disclosed that for detection of internal resistance, a polarization index is used as an index representing a polarization state (degree of influence of polarization), which expresses a solution concentration in the vicinity of the electrode by an amount of electric power. In this way, the internal resistance is highly accurately detected in consideration of change in solution concentration in the vicinity of the electrodes caused by charging/discharging as well as an amount of dissipation resulting from dispersion. Further, Patent document 2 describes that the internal resistance of the secondary battery is detected highly accurately and deterioration of the secondary battery is detected from increase in the internal resistance to surely prevent decreased engine startability and the like in advance.

Furthermore, Japanese Patent Laying-Open No. 2000-123886 (Patent document 3) discloses a full charge determining device capable of determining full charge state of a vehicular secondary battery irrespective of an influence of hysterisis. In particular, Patent document 3 discloses that the full charge state is determined by calculating the slope of a line of direct function representing a relation between change in voltage caused by polarization occurring in the battery and a polarization index representing the magnitude of polarization, and comparing for determination the calculated slope with the slope of a line of direct function representing a predetermined relation between the change in voltage upon a full charge state and the polarization index. Patent document 3 also describes that the change in voltage by polarization and the change in concentration of an electrolytic solution at a surface of an electrode are associated with each other.

Further, Japanese Patent Laying-Open No. 2006-42497 (Patent document 4) discloses that control for distributing driving force is optimized among a plurality of motive force sources of a motive force output device in accordance with a local SOC found based on estimated distribution of ion concentration within a secondary battery. A part of the motive force sources generate driving force using electric power supplied from a secondary battery. Specifically, the control for distributing driving force is modified according to a local SOC found based on the distribution of ion concentration at an electrode in the secondary battery as well as comparison with the entire SOC of the entire secondary battery.

Patent document 1: Japanese Patent Laying-Open No. 11-187577

Patent document 2: Japanese Patent Laying-Open No. 2004-31170

Patent document 3: Japanese Patent Laying-Open No. 2000-123886

Patent document 4: Japanese Patent Laying-Open No. 2006-42497

DISCLOSURE OF THE INVENTION

Problems to be Solved by the Invention

As described in each of Patent documents 1-4, in the normal control of charging/discharging of the secondary battery, abrupt progress of deterioration of the battery is prevented by setting the upper limit value of charging/discharging electric power according to the battery's state appropriately, and limiting the charging/discharging of the secondary battery within the range thus set. Generally, the upper limit value of charging/discharging electric power is determined to prevent the battery voltage from falling out of a management range (going above the upper limit value due to overcharge or going below the lower limit value due to overdischarge) or prevent the battery temperature from falling out of a management range (particularly too high temperature).

However, the present inventors has found that a specific type of secondary battery, such as a lithium ion battery, may suffer from progress of deterioration even when charging/discharging is controlled to maintain the battery temperature and the battery voltage within the above-described management ranges.

Such progress of deterioration will finally appear as increased internal resistance, but a preferable form of controlling charging/discharging is to figure out the secondary battery's tendency toward deterioration before the increase of the internal resistance, and to modify the charging/discharging control to counteract this tendency toward deterioration.

The present invention is made to solve the foregoing problems, and its object is to surely prevent deterioration of performance of a battery in advance by detecting progress of deterioration of a secondary battery and modifying control of charging/discharging, based on estimation of an electrolyte ion concentration between electrodes.

Means For Solving The Problems

A control system for a secondary battery according to the present invention is one for a secondary battery configured to exchange electric power with a load, the secondary battery including first and second electrodes each configured to include an active material containing a predetermined material, and an ionic conductor for conducting the ionized predetermined material between the first and second electrodes. The control system includes a concentration estimating unit and a charging/discharging control unit. The concentration estimating unit is configured to estimate an electrolyte ion concentration in an electrolytic solution of the ionic conductor based on a use state of the secondary battery. The charging/discharging control unit is configured to control charging/discharging of the secondary battery based on an estimated value of the electrolyte ion concentration provided by the concentration estimating unit, so as to maintain the electrolyte ion concentration within a normal range.

A method for controlling a secondary battery according to the present invention is one for controlling a secondary battery configured to exchange electric power with a load, the secondary battery including first and second electrodes each configured to include an active material containing a predetermined material, and an ionic conductor for conducting the ionized predetermined material between the first and second electrodes. The method includes the steps of estimating an electrolyte ion concentration in an electrolytic solution of the ionic conductor based on a use state of the secondary battery; and controlling charging/discharging of the secondary battery based on an estimated value of the electrolyte ion concentration provided by the step of estimating, so as to maintain the electrolyte ion concentration within a normal range.

According to the control system for a secondary battery and the control method therefor, charging/discharging of the secondary battery can be controlled (for example, modification of charging/discharging condition) to maintain the electrolyte ion concentration in the electrolytic solution of the ionic conductor (separator) (hereinafter, referred to as "electrolytic solution concentration") within the normal range. This beforehand and surely prevents deterioration of battery performance of a secondary battery having such a characteristic that its internal resistance increases when an amount of change in electrolytic solution concentration greatly differs depending on a charging/discharging condition and the change of electrolytic solution concentration is drastic. In this way, long life of the battery is achieved.

Preferably, in the control system for a secondary battery, the concentration estimating unit includes a first change ratio estimating unit and a concentration estimated value calculating unit. The first change ratio estimating unit is configured to calculate an estimated value of a ratio of change in the electrolyte ion concentration based on a charging/discharging current and a charging/discharging time of the secondary battery. The concentration estimated value calculating unit is configured to sequentially obtain the estimated value of the electrolyte ion concentration by accumulating a change in the electrolyte ion concentration caused by use of the secondary battery, according to the estimated value of the ratio of change calculated by the first change ratio estimating unit. Alternatively, in the method for controlling a secondary battery, the step of estimating includes the steps of calculating an estimated value of a ratio of change in the electrolyte ion concentration based on a charging/discharging current and a charging/discharging time of the secondary battery, and sequentially obtaining the estimated value of the electrolyte ion concentration by accumulating a change in the electrolyte ion concentration caused by use of the secondary battery, according to the estimated value of the ratio of change thus calculated.

More preferably, in the control system for a secondary battery, the first change ratio estimating unit is configured to make reference to a map storing a previously determined relation among the charging/discharging current, the charging/discharging time, and the ratio of change, so as to obtain the estimated value of the ratio of change for each charging/discharging of the secondary battery based on the charging/discharging current and the charging/discharging time. Alternatively, in the method for controlling a secondary battery, in the step of calculating, the estimated value of the ratio of change is obtained for each charging/discharging of the secondary battery based on the charging/discharging current and the charging/discharging time, with reference to a map storing a previously determined relation among the charging/discharging current, the charging/discharging time, and the ratio of change.

More preferably, in the control system for a secondary battery, the first change ratio estimating unit is configured to make reference to a map storing a previously determined relation among the charging/discharging current, the charging/discharging time, and the ratio of change for each electrolyte ion concentration, so as to obtain the estimated value of the ratio of change for each charging/discharging of the secondary battery, based on the electrolyte ion concentration, the charging/discharging current, and the charging/discharging time at the time of charging/discharging. Alternatively, in the method for controlling a secondary battery, in the step of calculating, the estimated value of the ratio of change is obtained for each charging/discharging of the secondary battery based on the electrolyte ion concentration, the charging/discharging current, and the charging/discharging time at the time of charging/discharging, with reference to a map storing a previously determined relation among the charging/discharging current, the charging/discharging time, and the ratio of change for each electrolyte ion concentration.

In this way, the change in electrolytic solution concentration caused by use (charging/discharging) of the secondary battery can be sequentially estimated by figuring out, through an experiment or the like conducted in advance, a characteristic of the ratio of change in the electrolytic solution concentration relative to the characteristic of the charging/discharging condition of the secondary battery (charging/discharging current×charging/discharging time).

Preferably, in the control system for a secondary battery, the concentration estimating unit further includes a second change ratio estimating unit. The second change ratio estimating unit is configured to calculate the estimated value of the ratio of change in the electrolyte ion concentration caused by relaxation of the secondary battery during a non-use period in which the charging/discharging of the secondary battery is stopped, at least based on a temperature of the secondary battery and a length of the non-use period. The concentration estimated value calculating unit is configured to calculate the estimated value of the electrolyte ion concentration at a start of use of the secondary battery based on the estimated value of the ratio of change calculated by the second change ratio estimating unit. Alternatively, in the method for controlling a secondary battery, the step of calculating includes a step of calculating the estimated value of the ratio of change in the electrolyte ion concentration caused by relaxation of the secondary battery during a non-use period in which the charging/discharging of the secondary battery is stopped, at least based on a temperature of the secondary battery and a length of the non-use period. In the step of sequentially obtaining, the estimated value of the electrolyte ion concentration at a start of use of the secondary battery is obtained based on the estimated value of the ratio of change calculated during the non-use period.

In this way, also during the non-use period in which charging/discharging of the secondary battery is stopped, a change in electrolytic solution concentration caused by influence of relaxation of the battery can be reflected. As a result, accuracy in estimating the electrolytic solution concentration can be improved, thereby improving accuracy in controlling charging/discharging to maintain the electrolytic solution concentration within the normal range. In this way, deterioration of the battery performance can be prevented more securely.

Preferably, in the control system for a secondary battery, the charging/discharging control unit includes a determining unit and a charging/discharging condition modifying unit. The determining unit is configured to determine that the electrolyte ion concentration is outside the normal range when a difference between the estimated value of the electrolyte ion concentration provided by the concentration estimating unit and an initial value of the electrolyte ion concentration is greater than a first predetermined value. The charging/discharging condition modifying unit is configured to modify a charging/discharging condition of the secondary battery to bring the electrolyte ion concentration back to the normal range when the determining unit determines that the electrolyte ion concentration is outside the normal range. Alternatively, in the method for controlling a secondary battery, the step of controlling charging/discharging includes the steps of determining that the electrolyte ion concentration is outside the normal range when a difference between the estimated value of the electrolyte ion concentration provided by the step of estimating and an initial value of the electrolyte ion concentration is greater than a first predetermined value, and modifying a charging/discharging condition of the secondary battery to bring the electrolyte ion concentration back to the normal range when it is determined that the electrolyte ion concentration is outside the normal range.

With such a configuration, when the electrolytic solution concentration estimated according to the use of the secondary battery is deviated from the initial concentration by a predetermined value or greater, it is determined that the electrolytic solution concentration goes out of the normal range, and the charging/discharging condition can be modified to bring the electrolyte ion concentration back to the normal range. In this way, the change in the electrolytic solution concentration can be limited within a predetermined range from the initial value, thus preventing progress of deterioration of the secondary battery.

Preferably, in the control system for a secondary battery, the charging/discharging control unit includes a concentration change detecting unit, a tendency sensing unit, a determining unit, and a charging/discharging condition modifying unit. The concentration change detecting unit is configured to obtain, for each predetermined period, an amount of change in the estimated value of the electrolyte ion concentration during the predetermined period. The tendency sensing unit is configured to calculate, based on the amount of change found by the concentration change detecting unit, a first frequency indicating how frequent the electrolyte ion concentration reaches/goes above a predetermined value, and a second frequency indicating how frequent the electrolyte ion concentration reaches/goes below a predetermined value. The determining unit is configured to determine that the electrolyte ion concentration is outside the normal range when the first frequency and the second frequency calculated by the tendency sensing unit satisfy a first predetermined condition. The charging/discharging condition modifying unit is configured to modify a charging/discharging condition of the secondary battery to bring back the electrolyte ion concentration to the normal range when the determining unit determines that the electrolyte ion concentration is outside the normal range. Alternatively, in the method for controlling a secondary battery, the step of controlling charging/discharging includes the steps of obtaining, for each predetermined period, an amount of change in the estimated value of the electrolyte ion concentration during the predetermined period, calculating, based on the amount of change thus obtained, a first frequency indicating how frequent the electrolyte ion concentration reaches/goes above a predetermined value, and a second frequency indicating how frequent the electrolyte ion concentration reaches/goes below a predetermined value, determining that the electrolyte ion concentration is outside the normal range when the first frequency and the second frequency satisfy a first predetermined condition, and modifying a charging/discharging condition of the secondary battery to bring back the electrolyte ion concentration to the normal range when it is determined that the electrolyte ion concentration is outside the normal range. More preferably, the predetermined period is a period of time with a fixed length or corresponds to a period of time from start of driving of the load to end of the driving.

In this way, by tracing tendency of change in the electrolytic solution concentration for each fixed time or each period of a single travel (period of time from start to end of traveling of the vehicle), it can be determined whether or not the electrolytic solution concentration is within the normal range. In this way, before the electrolytic solution concentration is drastically deviated from the initial value, a tendency of use, i.e., a tendency of charging the secondary battery too much (increase of the electrolytic solution concentration) or a tendency of discharging too much (decrease of the electrolytic solution concentration) can be figured out, whereby modification of the charging/discharging condition can be effected at an earlier stage to maintain the electrolytic solution concentration within the normal range. In this way, an effect of preventing deterioration of performance of the battery in advance can be improved more.

More preferably, in the control system for a secondary battery, the determining unit is configured to determine that the electrolyte ion concentration is brought back to the normal range, when the difference between the estimated value of the electrolyte ion concentration and the initial value of the electrolyte ion concentration is brought to be smaller than a second predetermined value smaller than the first predetermined value after the determining unit has determined that the electrolyte ion concentration is outside the normal range, and the charging/discharging condition modifying unit is configured to stop modifying the charging/discharging condition when the determining unit determines that the electrolyte ion concentration is brought back to the normal range. Alternatively, the determining unit is configured to determine that the electrolyte ion concentration is brought back to the normal range when the first frequency and the second frequency calculated by the tendency sensing unit satisfy a second predetermined condition after the determining unit has determined that the electrolyte ion concentration is outside the normal range. The charging/discharging condition modifying unit is configured to stop modifying the charging/discharging condition when the determining unit determines that the electrolyte ion concentration is brought back to the normal range.

More preferably, in the method for controlling a secondary battery, the step of determining includes a sub step of determining that the electrolyte ion concentration is brought back to the normal range, when the difference between the estimated value of the electrolyte ion concentration and the initial value of the electrolyte ion concentration is brought to be smaller than a second predetermined value smaller than the first predetermined value after it has been determined that the electrolyte ion concentration is outside the normal range. The step of controlling charging/discharging includes a step of stopping modifying the charging/discharging condition when the sub step of determining determines that the electrolyte ion concentration is brought back to the normal range. Alternatively, the step of determining includes a step of determining that the electrolyte ion concentration is brought back to the normal range when the first frequency and the second frequency thus calculated satisfy a second predetermined condition after it has been determined that the electrolyte ion concentration is outside the normal range. The step of controlling charging/discharging further includes a step of stopping modifying the charging/discharging condition when the step of determining determines that the electrolyte ion concentration is brought back to the normal range.

In this way, after the electrolytic solution concentration is brought back to the normal range, the modification of the charging/discharging condition is stopped. Hence, in a range in which there is no adverse influence for deterioration of the battery, the performance of the secondary battery can be exhibited maximally. Further, hysterisis is provided between the condition for determining whether or not the electrolytic solution concentration falls out of the normal range and the condition for determining whether the electrolytic solution concentration is brought back to the normal range from outside the normal range, thus preventing charging/discharging control from being unstable due to frequent change (hunting) of results of determination as to whether the electrolytic solution concentration is inside/outside the normal range and frequent execution/stop of modification of the charging/discharging condition.

Preferably, in the control system for a secondary battery, the charging/discharging control unit includes a determining unit and a charging/discharging condition modifying unit. The determining unit is configured to determine whether or not the electrolyte ion concentration is within the normal range, in accordance with the estimated value of the electrolyte ion concentration provided by the concentration estimating unit. The charging/discharging condition modifying unit is configured to make a predetermined time relatively shorter than that when the electrolyte ion concentration is within the normal range, in limiting the charging/discharging by setting a first electric power and a second electric power able to be continuously input and output to and from the secondary battery over the predetermined time, when the determining unit determines that the electrolyte ion concentration is outside the normal range. Alternatively, the charging/discharging condition modifying unit is configured to decrease an absolute value of at least one of a first electric power and a second electric power able to be continuously input and output to and from the secondary battery over a predetermined time, as compared with that when the electrolyte ion concentration is within the normal range, in limiting the charging/discharging by setting the first and the second electric powers, when the determining unit determines that the electrolyte ion concentration is outside the normal range.

Preferably, in the method for controlling a secondary battery, the step of controlling charging/discharging includes the steps of determining whether or not the electrolyte ion concentration is within the normal range, in accordance with the estimated value of the electrolyte ion concentration provided by the step of estimating, and making a predetermined time relatively shorter than that when the electrolyte ion concentration is within the normal range, in limiting the charging/discharging by setting a first electric power and a second electric power able to be continuously input and output to and from the secondary battery over the predetermined time, when it is determined that the electrolyte ion concentration is outside the normal range. Alternatively, the step of controlling charging/discharging includes the steps of determining whether or not the electrolyte ion concentration is within the normal range, in accordance with the estimated value of the electrolyte ion concentration provided by the step of estimating, and decreasing an absolute value of at least one of a first electric power and a second electric power able to be continuously input and output to and from the secondary battery over a predetermined time, as compared with that when the electrolyte ion concentration is within the normal range, in limiting the charging/discharging by setting the first and the second electric powers, when it is determined that the electrolyte ion concentration is outside the normal range.

In this way, when the electrolyte ion concentration is outside the normal range, charging/discharging is limited strictly by a combination of the charging/discharging power upper limit values of the secondary battery and upper time limits of charging/discharging with the upper limit values. Accordingly, charging/discharging can be avoided in a limit region in which the electrolytic solution concentration is likely to increase or decrease. By limiting use of the secondary battery in such a limit region, charging/discharging can be controlled to bring the electrolytic solution concentration back to the normal range.

Preferably, the predetermined material is lithium.

In this way, in a lithium ion battery having such a characteristic that electrolytic solution concentration is greatly changed by charging/discharging in a large current region and internal resistance is abruptly increased when the change in the electrolytic solution concentration reaches or exceeds a predetermined value, deterioration of performance of the battery can be surely prevented in advance, thus achieving long life thereof.

An electrically powered vehicle according to the present invention includes any one of the control systems each for a secondary battery, and a motor provided as a load for the control system for a secondary battery. Further, the electrically powered vehicle is configured so that the motor generates a vehicle driving force. Alternatively, the secondary battery controlled by the above-described method for controlling a secondary battery is mounted on an electrically powered vehicle, and a load includes a motor for generating a driving force for a wheel of the electrically powered vehicle.

With such a configuration, deterioration of the battery performance of the secondary battery mounted on the electrically powered vehicle can be prevented surely in advance, thus achieving long life of the secondary battery, which is used as a vehicle driving force generating source.

Effects of the Invention

According to a control system for a secondary battery, an electrically powered vehicle having the control system mounted thereon, and a method for controlling a secondary battery according to the present invention, deterioration of battery performance can be surely prevented in advance by detecting progress of deterioration of the secondary battery and modifying charging/discharging control based on estimation of electrolyte ion concentration (electrolytic solution concentration) between electrodes.

BRIEF DESCRIPTION OF THE DRAWINGS

FIG. 19 is a flowchart illustrating a control structure of a subroutine for implementing operations of the determining configuration shown in FIG. 17 through software processing performed by the battery ECU.

DESCRIPTION OF THE REFERENCE SIGNS

Figure 1:
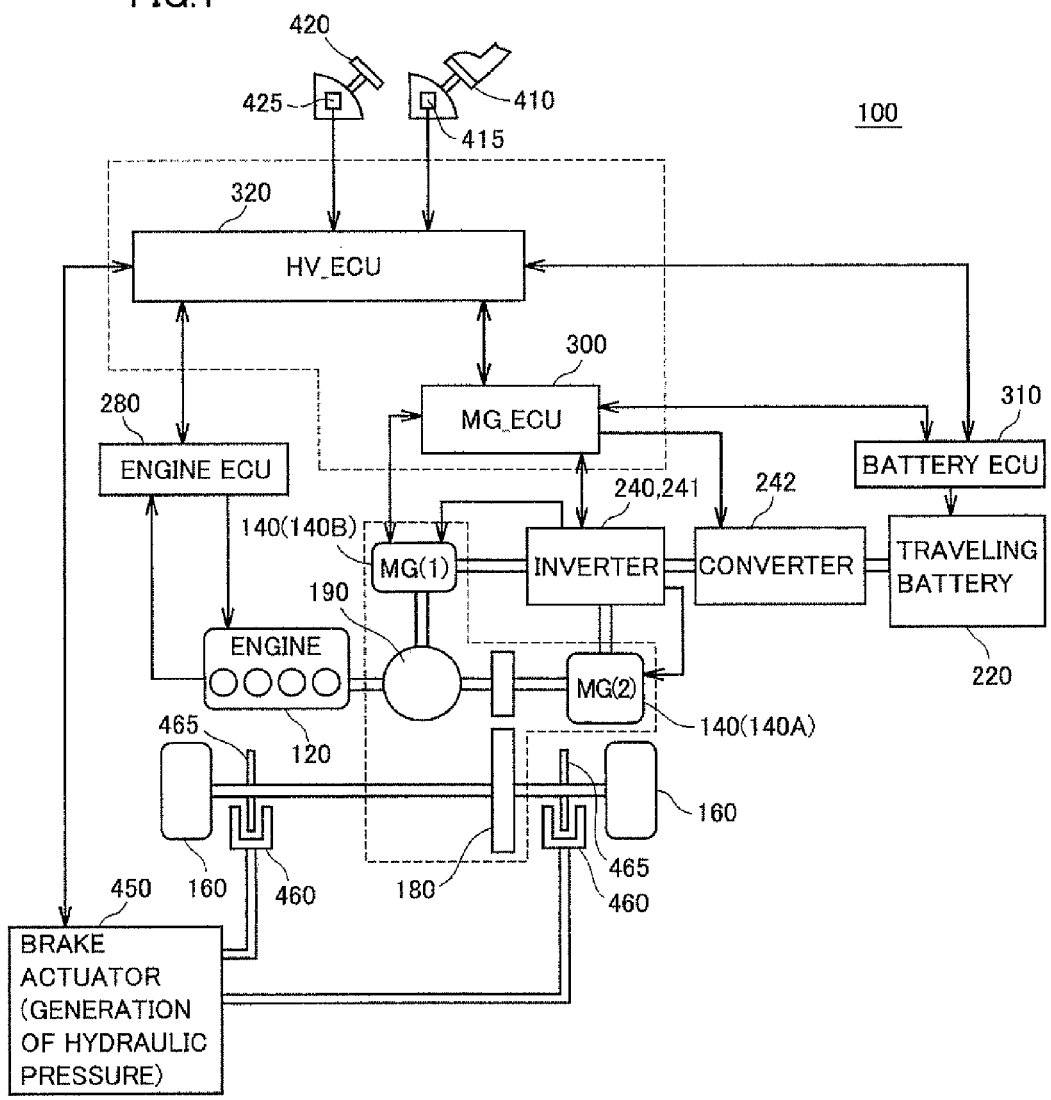
FIG. 1 is a control block diagram of a hybrid vehicle having thereon a secondary battery controlled by a control system and a control method for a secondary battery according to an embodiment of the present invention.

11*p*: positive electrode terminal; 11*n*: negative electrode terminal; 12: negative electrode; 13, 16: current collector; 14: separator; 15: positive electrode; 18: active material; 100: hybrid vehicle; 120: engine; 140A, 140B: motor generator; 160: driving wheel; 180: speed reducer; 190: motive power splitting mechanism; 200: control system;

202, 202#: electrolytic solution concentration estimating unit; 204: charging/discharging control unit; 205: battery state estimating unit; 210: concentration change ratio estimating unit (in use); 215: concentration change ratio estimating unit (not in use); 220: traveling battery; 220#: battery cell; 221, 225: map; 222: current sensor; 224: temperature sensor; 226: voltage sensor; 230: concentration estimated value calculating unit; 240, 241: inverter; 242: converter; 250, 255: determining unit; 250#: determining configuration; 252: concentration change detecting unit; 254: tendency sensing unit; 260: charging/discharging condition modifying unit; 300: MG_ECU; 310: battery ECU; 320: HV_ECU; 410: accelerator pedal; 415: accelerator pedal sensor; 420: brake pedal; 425: brake pedal sensor; 450: brake actuator; 460: brake mechanism; 465: disc rotor; B#: electrolytic solution concentration estimated value; B0: initial concentration; FL: flag (inside/outside normal range); h(N1, N2): tendency management value; Ib: battery current (charging/discharging current); t(Win): charging time limit; t(Wout): discharging time limit; Tb: battery temperature; that: charging/discharging time; Tbst: battery temperature (not in use); Trg: trigger signal; tst: non-use time; Vb: battery voltage; Win: charging power upper limit value; Wout: discharging power upper limit value; α1, α2, β1, β2: criteria value; ΔB: ratio of change in electrolytic solution concentration (for each charging/discharging, during non-use period); ΔB#(n): amount of change in electrolytic solution concentration (predetermined period); ΔR: amount of increase in internal resistance.

BEST MODES FOR CARRYING OUT THE INVENTION

An embodiment of the present invention will be described below in detail with reference to figures. The same or equivalent portions in the figures are given the same reference characters and will not be described repeatedly in principle.

FIG. 1 is a control block diagram of a hybrid vehicle presented as a representative example of an electrically powered vehicle having a control system for a secondary battery according to the embodiment of the present invention.

FIG. 1 is the control block diagram of the hybrid vehicle presented as the representative example of the electrically powered vehicle having a secondary battery controlled by the control system for a secondary battery and a control method therefor both according to the embodiment of the present invention. It should be noted that the electrically powered vehicle is not limited to the hybrid vehicle shown in FIG. 1 and the present invention is applicable to hybrid vehicles having other configurations (for example, a series type hybrid vehicle).

Referring to FIG. 1, hybrid vehicle 100 includes an internal combustion engine (hereinafter, simply referred to as "engine") 120 such as a gasoline engine or a diesel engine, and a motor generator (MG) 140, serving as a vehicle driving force generating source. Motor generator 140 includes a motor generator 140A (hereinafter, also simply referred to as "motor 140A" for ease of description) mainly serving as a motor, and a motor generator 140B (hereinafter, also simply referred to as "motor 140B" for ease of description) mainly serving as a generator. It should be noted that motor 140A may operate as a generator and generator 140B may operate as a motor, depending on a traveling state of hybrid vehicle 100.

In addition to these, hybrid vehicle 100 includes a speed reducer 180 for transmitting to a driving wheel 160 the motive powers generated by engine 120 and motor generator 140A and for transmitting a driving power from driving wheel 160 to engine 120 and motor generator 140A; a motive power splitting mechanism (for example, planetary gear mechanism) 190 for distributing the motive power generated by engine 120 into two paths, i.e., driving wheel 160 and generator 140B; a traveling battery 220 for charging electric power for driving motor generators 140A, 140B; an inverter 240 for controlling current while converting direct current of traveling battery 220 from/to alternating current of motor generator 140A; and an inverter 241 for controlling current while converting direct current of traveling battery 220 from/to alternating current of motor generator 140B.

Traveling battery 220 corresponds to the "secondary battery" controlled by the control system and control method for a secondary battery according to the embodiment of the present invention.

Hybrid vehicle 100 further includes a battery control unit (hereinafter, referred to as battery ECU (Electronic Control Unit)) 310 for managing and controlling charging/discharging of traveling battery 220; an engine ECU 280 for controlling an operation state of engine 120; an MG_ECU 300 for controlling motor generators 140A, 140B, battery ECU 310, inverter 240, and the like in accordance with a state of the hybrid vehicle; and an HV_ECU 320 for controlling the entire hybrid system by mutually managing and controlling battery ECU 310, engine ECU 280, MG_ECU 300, and the like to operate hybrid vehicle 100 most effectively.

An accelerator pedal sensor 415 is connected to accelerator pedal 410 operated by a driver, and generates an output voltage according to a driver-operated amount (pedal angle) of accelerator pedal 410. Likewise, a brake pedal sensor 425 is connected to a brake pedal 420 operated by a driver, and generates an output voltage according to driver-operated amount (pedaling force) of brake pedal 420. The output voltages of accelerator pedal sensor 415 and brake pedal sensor 425 are sent to HV_ECU 320. Thus, HV_ECU 320 can detect the driver-operated amounts of accelerator pedal 410 and brake pedal 420.

In the present embodiment, a converter 242 is provided between traveling battery 220 and inverter 240. Accordingly, even when traveling battery 220 has a rated voltage smaller than those of motor generator 140A and motor generator 140B, converter 242 steps up or down the voltage, whereby electric power can be exchanged between traveling battery 220 and motor generators 140A, 140B. Converter 242 has a built-in smoothing capacitor not shown in the figures, and the smoothing capacitor is capable of storing electric charges therein when converter 242 operates to step up a voltage.

In FIG. 1, the ECUs are configured separately but may be configured as an ECU in which two or more ECUs are incorporated (one example of such an ECU is, for example, one having MG_ECU 300 and HV_ECU 320 incorporated therein as indicated by a dotted line in FIG. 1).

As motive power splitting mechanism 190, a planetary gear mechanism (planetary gear) is representatively used to distribute the motive power generated by engine 120 to both driving wheel 160 and motor generator 140B. By controlling the rotation speed of motor generator 140B, motive power splitting mechanism 190 also serves as a continuously variable transmission. Torque of engine 120 is input to a planetary carrier (C), and is transmitted to motor generator 140B by a sun gear (S) and is transmitted to the motor and an output shaft (the driving wheel 160 side) by a ring gear (R). When stopping engine 120 currently being rotated, kinetic energy resulting from the rotation of engine 120 is converted by motor generator 140B into electric energy to decrease the rotation speed of engine 120.

In hybrid vehicle 100 having the hybrid system mounted thereon as shown in FIG. 1, when engine 120 is poor in efficiency at startup or during slow speed traveling, the hybrid vehicle travels only using motor 140A of motor generator 140. During normal traveling, for example, motive power splitting mechanism 190 splits the motive power provided from engine 120 into the two paths, thereby directly driving driving wheel 160 on one hand and driving generator 140B to generate electric power on the other hand. The electric power generated on this occasion is employed to drive motor 140A to assist driving of driving wheel 160. During fast traveling, electric power is supplied from traveling battery 220 to motor 140A to increase the output of motor 140A, thus providing extra driving power to driving wheel 160.

Meanwhile; upon deceleration, motor 140A, which operates according to driving wheel 160, serves as a generator to generate electric power through regenerative braking, and the electric power thus recovered can be stored in traveling battery 220. It should be noted that the regenerative braking herein includes braking involving generation of regenerative power when a driver who drives the hybrid car operates the foot brake, as well as deceleration of the vehicle (or halt of acceleration) by easing off the accelerator pedal during traveling to generate regenerative power without operating the foot brake.

Regenerative power that can be generated is set according to a permissible value (upper limit value) of electric power charged to traveling battery 220. In other words, while traveling battery 220 is prohibited from being charged, regenerative power generation is also prohibited and the torque command value of motor generator 140A is set at zero.

Further, when an amount of charge in traveling battery 220 is decreased and traveling battery 220 therefore particularly needs to be charged, the output of engine 120 is increased to increase an amount of electric power generated by generator 140B. In this way, an amount of charge supplied to traveling battery 220 is increased. Also during slow speed traveling, the output of engine 120 is controlled to increase when required, for example, when traveling battery 220 needs to be charged as described above, when driving an auxiliary device such as an air conditioner, when increasing the temperature of coolant in engine 120 to a predetermined temperature, and the like, Each of driving wheel 160 and wheels not shown in the figures is provided with a brake mechanism 460. Brake mechanism 460 is configured to obtain braking force of the vehicle from friction force generated by pressing a disc rotor 465, which is provided corresponding to each wheel, with a brake pad (friction material) operated by hydraulic pressure generated by brake actuator 450. An amount of hydraulic pressure generated by brake actuator 450 is controlled by HV_ECU 320.

HV_ECU 320 calculates total braking force required by the entire vehicle, from the operated amount of brake pedal 420 and the like. HV_ECU 320 performs control so that the total required braking force thus calculated is generated cooperatively by regenerative braking force provided by motor 140A and hydraulic braking force provided by brake mechanism 460.

Figure 2:
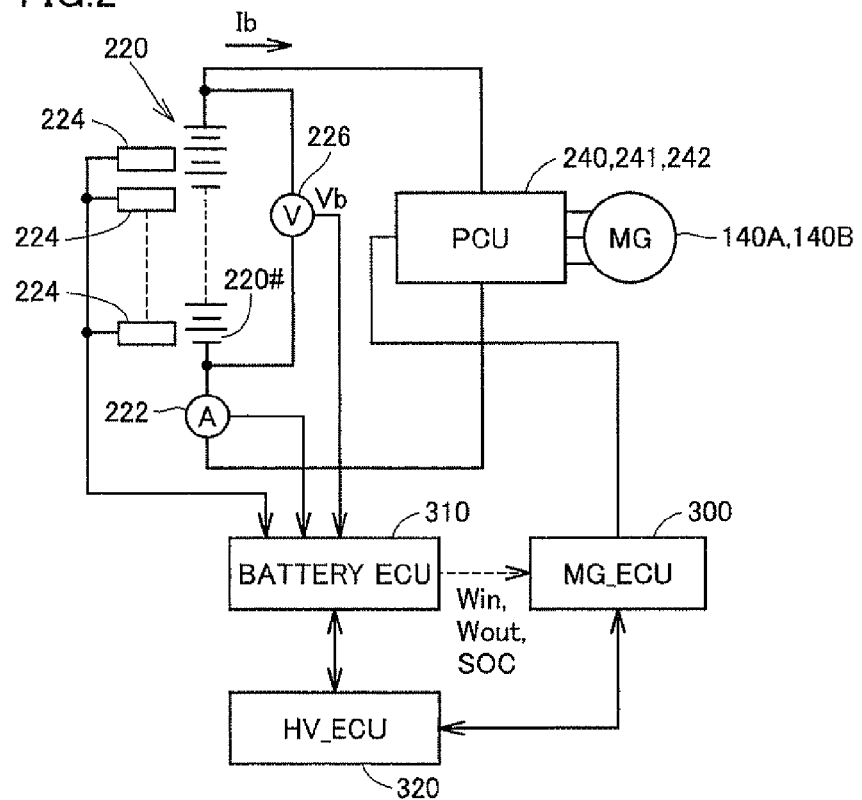
FIG. 2 is a block diagram showing a schematic configuration of the control system for a secondary battery according to the embodiment of the present invention.

FIG. 2 shows a schematic configuration of the control system for a secondary battery according to the embodiment of the present invention.

Traveling battery 220 is constituted by a battery pack in which a plurality of battery cells 220# are connected to one another. As described below, traveling battery 220 is constituted representatively by a lithium ion secondary battery.

Traveling battery 220 is connected to motor generators 140A, 140B (MG (1), MG (2)) via inverters 240, 241, and converter 242. In other words, in the present embodiment, a PCU (Power Control Unit) made up of inverters 240, 241, and converter 242, as well as motor generators 140A, 140B (MG (1), MG (2)) integrally constitute a "load" of traveling battery 220.

Further, there are provided a voltage sensor 226 for detecting a terminal voltage (hereinafter, referred to as "battery voltage Vb") of traveling battery 220, and a current sensor 222 for detecting a current flowing in traveling battery 220. Another voltage sensor 226 may be further provided, in order to measure not only the voltage between the terminals but also an output voltage of each battery block (not shown) constituted by a predetermined number of battery cells 220#.

In the description below, the input/output current, detected by current sensor 222, between traveling battery 220 and the load will be referred to as "battery current Ib". It should be noted that a direction indicated by an arrow in a figure is defined as the positive current direction of battery current Ib. In other words, Ib>0 (positive) upon discharging, whereas Ib<0 (negative) upon charging. Hence, input/output electric power to/from the load of traveling battery 220 is represented by a product of battery voltage Vb and battery current Ib, has a positive value upon discharging, and has a negative value upon charging.

At a plurality of locations in traveling battery 220, temperature sensors 224 are provided to detect a battery temperature. A reason why temperature sensors 224 are provided at the plurality of locations is because the temperature of traveling battery 220 may differ locally. Outputs of current sensor 222, voltage sensor 226, and temperature sensors 224 are sent to battery ECU 310.

Based on these sensor output values, battery ECU 310 calculates remaining capacity of the battery (SOC) and limits charging/discharging of the battery.

Representatively, the charging/discharging is controlled to match the estimated SOC with a target SOC. Further, to prevent overcharge/overdischarge of traveling battery 220, battery ECU 310 determines a charging power upper limit value Win (Win$\leq$0) and a discharging power upper limit value Wout (Wout$\geq$0), and sends them to MG_ECU 300 and HV_ECU 320.

For example, charging power upper limit value Win is set to prevent battery voltage Vb from being higher than the maximal permissible voltage (upper limit voltage) or prevent the SOC from being higher than the upper limit management value, due to overcharge, Likewise, discharging power upper limit value Wout is set to prevent battery voltage Vb from being lower than the minimal permissible voltage (lower limit voltage), or prevent the SOC from being lower than the lower limit management value, due to overdischarge. Here, the upper limit voltage and lower limit voltage are determined according to the maximal rated voltage and minimal rated voltage of traveling battery 220, a voltage allowing for (guaranteeing) operations of the devices (load) connected to traveling battery 220, or the like. The absolute values of charging/discharging power upper limit values Win, Wout are also varied according to battery temperature Tb, and are kept low when battery temperature Tb is high and low, as compared with those at a normal temperature.

Particularly, HV_ECU 300 sets an operation command value (representatively, torque command value) for each of motor generators 140A, 140B, to charge/discharge traveling battery 220 within a range between charging power upper limit value Win and discharging power upper limit value Wout. For example, the above-described distribution of the output of the vehicular driving power between engine 120 and motor 140A according to a traveling state is considered so that electric power output from traveling battery 220 and including electric power to be consumed by motor 140A does not exceed discharging power upper limit value Wout.

Meanwhile, upon regenerative braking, a torque command value (generally, negative torque) for motor generator 140A is set while electric power input to traveling battery 220 and including electric power generated by motor generator 140A is considered not to exceed charging power upper limit value Win. As described above, when a driver operates the brake, HV_ECU 320 cooperatively controls regenerative braking force provided by motor generator 140A and hydraulic braking force provided by brake mechanism 460 to obtain a total required braking force from the sum of the braking forces. Hence, even though regenerative braking force provided by motor generator 140A is limited by charging power upper limit value Win, a required vehicular braking force can be obtained.

Figure 3:
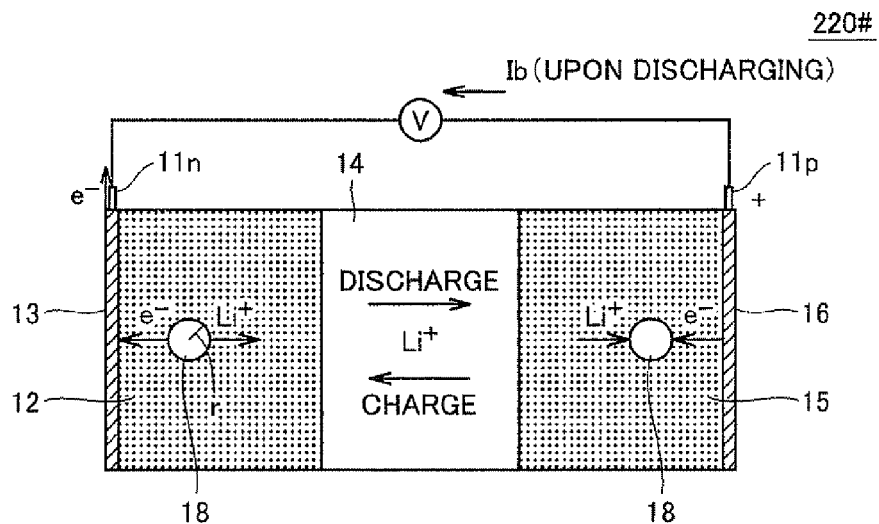
FIG. 3 is a conceptual diagram illustrating a configuration of a battery cell constituting a traveling battery shown in FIG. 1.

FIG. 3 is a schematic diagram of a battery cell constituting traveling battery 220 shown in FIG. 1. As described above, traveling battery 220 is configured as a battery pack in which battery cells 220# each shown in FIG. 3 are connected in series or in series-parallel.

Referring to FIG. 3, each of battery cells 220# includes a negative electrode 12, a separator 14, and a positive electrode 15. Separator 14 is formed by impregnating with an electrolytic solution a resin provided between the negative electrode and the positive electrode. Separator 14 corresponds to an "ionic conductor" in the present invention.

Each of negative electrode 12 and positive electrode 15 is constituted by a collection of spherical active materials 18. Upon discharging, on an interface of active materials 18 in negative electrode 12, an electrochemical reaction occurs to emit a lithium ion Li+ and an electron e−. On the other hand, on interfaces of active materials 18 in positive electrode 15, an electrochemical reaction occurs to absorb lithium ion Li+ and electron e−.

Negative electrode 12 is provided with a current collector 13 for absorbing electron e−, whereas positive electrode 15 is provided with a current collector 16 for emitting electron e−. Current collector 13 of the negative electrode is representatively formed of copper, whereas current collector 16 of the positive electrode is representatively formed of aluminum. Current collector 13 is provided with a negative electrode terminal 11n, and current collector 16 is provided with a positive electrode terminal 11p. Lithium ion Li+ is exchanged through separator 14, thereby charging/discharging battery cells 220#. Accordingly, charging current Ib (>0) or discharging current Ib (<0) is generated.

Where battery cells 220# are constituted by a lithium ion secondary battery, lithium salt serving as a supporting electrolyte is dissolved in a solvent of the electrolytic solution. Here, electrolyte ion concentration in the electrolytic solution of separator 14 is hereinafter also simply referred to as "electrolytic solution concentration".

Now, a characteristic of an electrolytic solution concentration in a secondary battery will be described with reference to FIGS. 4 and 5. The characteristic is noticeable in a specific type of battery such as a lithium ion secondary battery.

Figure 4:
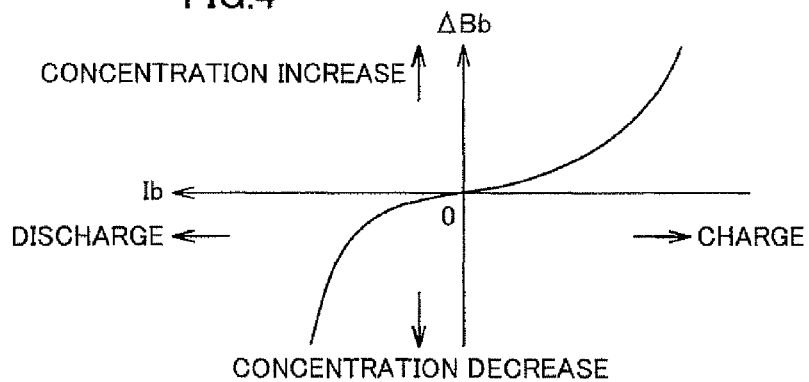
FIG. 4 is a conceptual diagram illustrating a relation between a charging/discharging current and a change in electrolytic solution concentration in a specific type of secondary battery represented by a lithium ion secondary battery.

Referring to FIG. 4, the present inventors found that a specific type of secondary battery has such a characteristic that an amount of change $\Delta Bb$ in electrolytic solution concentration is not increased so much by charging/discharging with a small current but is abruptly increased by charging/discharging with a large current. Specifically, the electrolytic solution concentration is changed greatly to increase by charging with a large current, and is changed greatly to decrease by discharging with a large current.

Hence, when charging/discharging the secondary battery within the normal current range in use, the secondary battery is repeatedly charged/discharged to adjust the remaining capacity (SOC) to a fixed value and the electrolytic solution concentration do not increase or decrease so much from the initial value (value in the brand new condition).

However, if a driver of the hybrid vehicle has a characteristic or the like of, for example, frequently accelerating the traveling speed greatly to result in discharging with a large current, the electrolytic solution concentration may greatly decrease from the initial value as the secondary battery is used more. On the other hand, if the hybrid vehicle is driven under use conditions that regenerative power is generated frequently by traveling in a sloping road or the like, the battery tends to be overcharged, with the result that the electrolytic solution concentration may greatly increase from the initial value as the secondary battery is used more.

Figure 5:
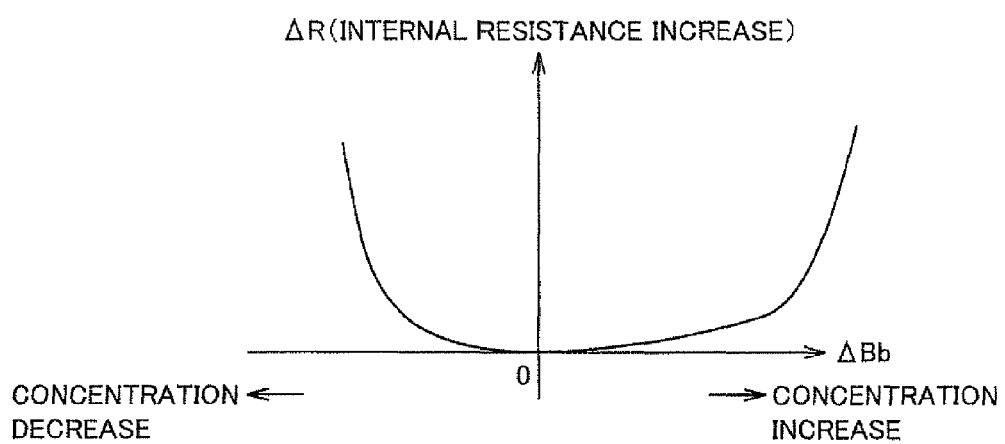
FIG. 5 is a conceptual diagram illustrating a relation between the change in electrolytic solution concentration and increase in internal resistance, in the specific type of secondary battery represented by a lithium ion secondary battery.

Meanwhile, as shown in FIG. 5, the present inventors found that a specific type of battery such as a lithium ion secondary battery has such a characteristic that increase in internal resistance is not so noticeable in a region in which amount of change $\Delta Bb$ in electrolytic solution concentration is not so large, but when amount of change $\Delta Bb$ in electrolytic solution concentration reaches or exceeds a predetermined value, an amount of increase $\Delta R$ in internal resistance is drastically increased from that in the brand new condition.

Namely, when the electrolytic solution concentration is changed from the initial value to enter the region in which the increase of internal resistance is noticeable, the battery's performance may be limited and problems may arise in the life of the secondary battery. Hence, it is appreciated that what is important to efficiently prevent deterioration of a secondary battery is not to feedback the change in internal resistance to modify the charging/discharging condition, but is to control charging/discharging so that the change in electrolytic solution concentration falls within the normal range at a stage before the change in internal resistance.

In view of such findings, the control system and control method for a secondary battery according to the embodiment of the present invention controls charging/discharging of the secondary battery to maintain the electrolytic solution concentration within a predetermined normal range, as described below.

Figure 6:
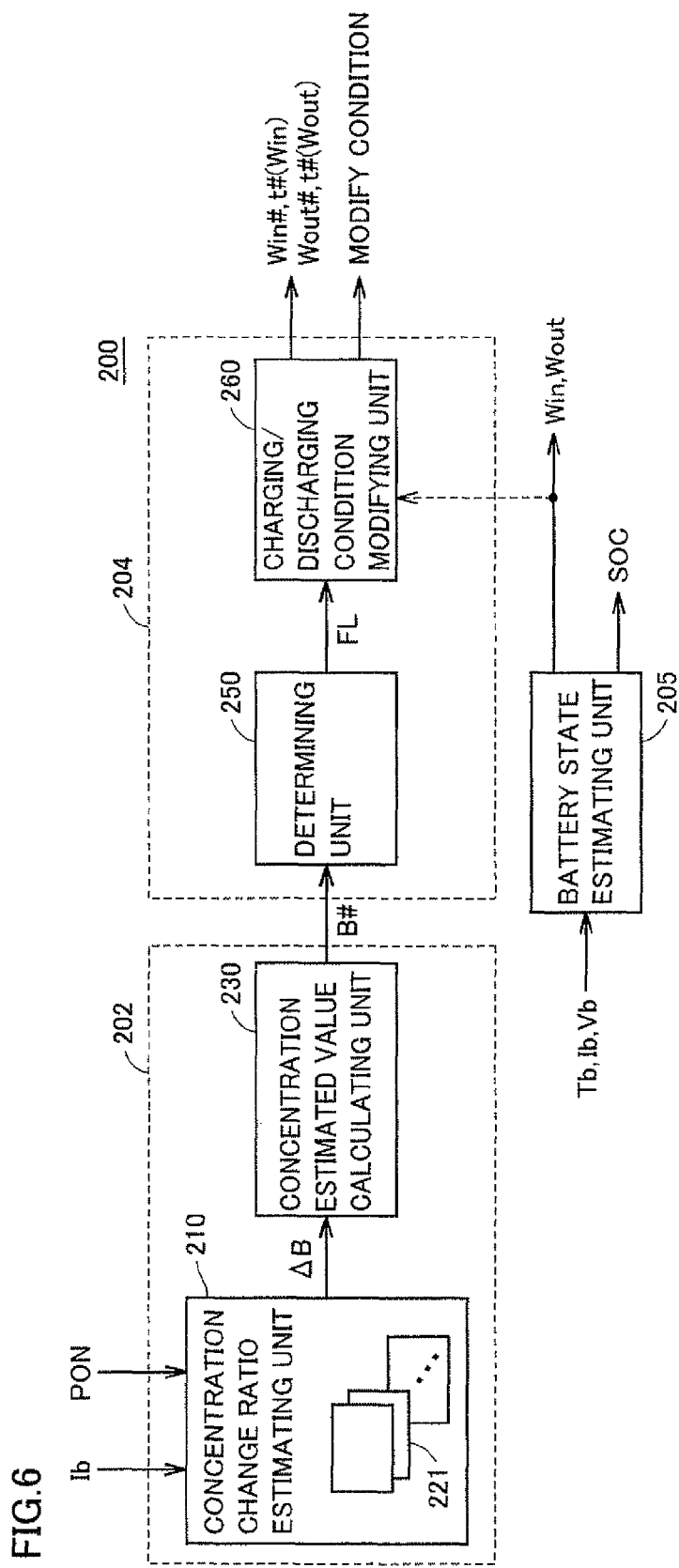
FIG. 6 is a schematic block diagram illustrating the configuration of the control system for a secondary battery according to the embodiment of the present invention.

FIG. 6 is a schematic block diagram showing a configuration of the control system for a secondary battery in the embodiment of the present invention.

Referring to FIG. 6, control system 200 for a secondary battery according to the embodiment of the present invention includes an electrolytic solution concentration estimating unit 202 configured to estimate electrolytic solution concentration based on a use state of the secondary battery; and a charging/discharging control unit 204 for controlling charging/discharging of the secondary battery based on an electrolytic solution concentration estimated value B# provided by electrolytic solution concentration estimating unit 202, so as to maintain the electrolytic solution concentration within the normal range.

Control system 200 further includes a battery state estimating unit 205 for estimating a state of the secondary battery based on quantities of state of the secondary battery such as battery temperature Tb, battery current Ib, and battery voltage Vb to find a remaining capacity estimated value (estimated SOC). Based on estimated SOC and the battery state (representatively, battery temperature Tb), battery state estimating unit 205 sets charging power upper limit value Win and discharging power upper limit value Wout of the secondary battery.

Electrolytic solution concentration estimating unit 202 includes a concentration change ratio estimating unit 210 for estimating a ratio of change $\Delta B$ in the electrolytic solution concentration during use of the secondary battery based on the charging/discharging current (battery current Ib) in response to an on signal PON for a power switch for operating the hybrid system, i.e., a signal corresponding to an instruction for starting driving of hybrid vehicle 100; and a concentration estimated value calculating unit 230 for sequentially calculating electrolytic solution concentration estimated value B# in accordance with estimated ratio of change $\Delta B$ during use of the secondary battery. Concentration change ratio estimating unit 210 includes a map 221 for estimating ratio of change $\Delta B$ in the electrolytic solution concentration based on the charging/discharging current.

Charging/discharging control unit 204 includes a determining unit 250 for determining whether or not the electrolytic solution concentration is within the normal range, based on electrolytic solution concentration estimated value B# estimated by concentration estimated value calculating unit 230; and a charging/discharging condition modifying unit 260 for modifying a charging/discharging condition of the secondary battery according to a flag FL indicative of a result of determination by determining unit 250, to bring the electrolytic solution concentration back to the normal range when the electrolytic solution concentration falls out of the normal range.

The following describes operations of each block in detail. Described first are operations of concentration change ratio estimating unit 210 and concentration estimated value calculating unit 230 both constituting electrolytic solution concentration estimating unit 202.

Figure 7:
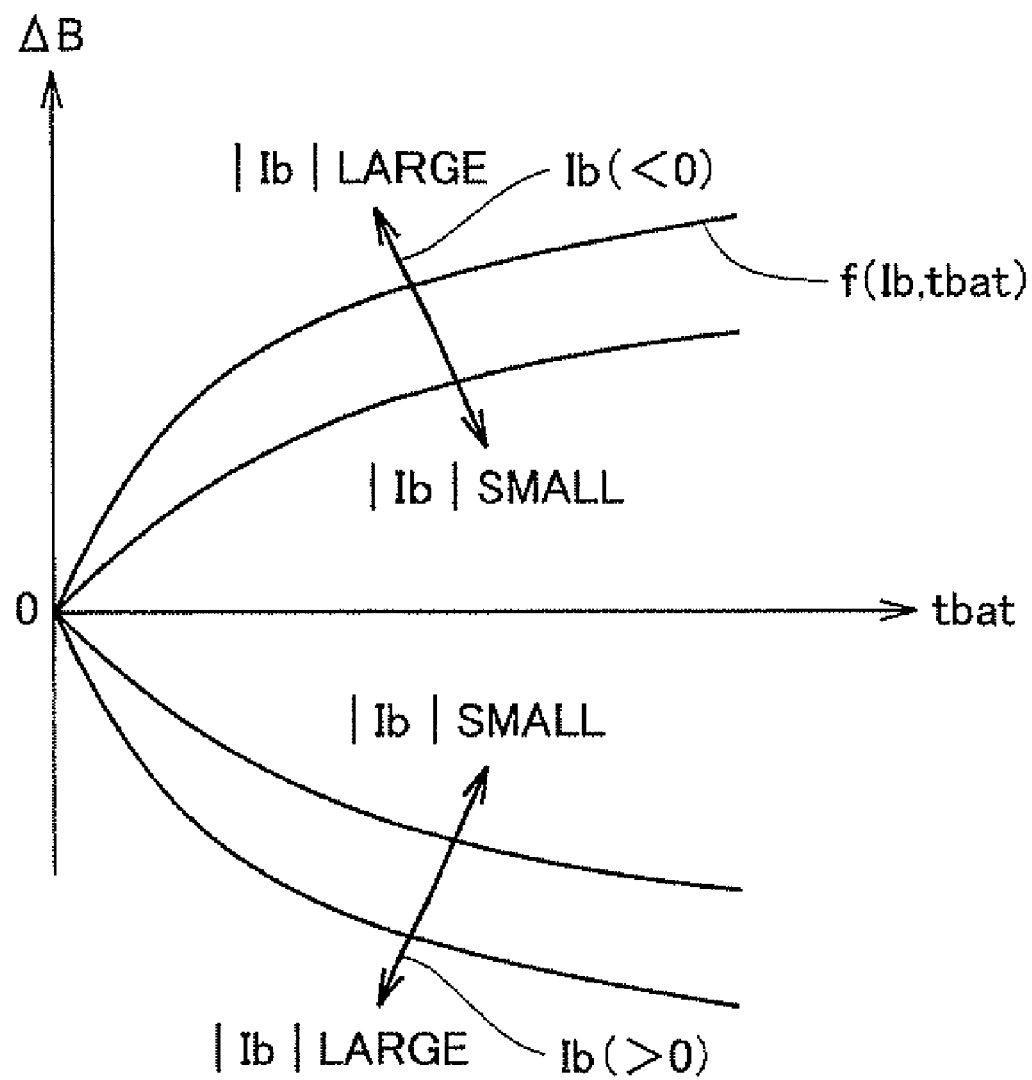
FIG. 7 is a conceptual diagram showing characteristics of a degree of change in electrolytic solution concentration relative to charging/discharging time involving charging/discharging with a fixed current.

As shown in FIG. 7, electrolytic solution concentration in the secondary battery changes according to charging/discharging of the secondary battery. FIG. 7 shows characteristics of a ratio of change $\Delta B$ in electrolytic solution concentration caused by charging/discharging with a fixed current, relative to time that (horizontal axis) of charging/discharging with the current. Such characteristics can be found by measuring changes in electrolytic solution concentration during an experiment of actually charging/discharging the secondary battery with currents of various values.

Based on the result of such an experiment, ratio of change $\Delta B$ in electrolytic solution concentration caused by charging/discharging of the secondary battery can be represented as $\Delta B = f(Ib, tbat)$ where $f(Ib, tbat)$ is a function of charging/ discharging current Ib and charging/discharging time tbat. Assume that ratio of change ΔB is represented by ratio of change (%) from the electrolytic solution concentration at the start of the charging/discharging. Namely, the initial value thereof at the start of the charging/discharging (tbat=0) is ΔB=0.

As shown in FIG. 7, as absolute value |Ib| of the charging/discharging current is larger, absolute value |ΔB| of the ratio of change in electrolytic solution concentration tends to be larger. Particularly, when the charging/discharging current reaches or exceeds a predetermined value, absolute value |Bb| of the amount of change is drastically larger.

More specifically, based on function f(Ib, tbat) representing the characteristics found by the previously conducted experiments and the like with various currents as shown in FIG. 7, map 221 can be constructed to extract ratio of change ΔB=f(Ib, tbat) as a map value according to charging/discharging current Ib and charging/discharging time tbat. In this way, whenever charging/discharging of the secondary battery with a fixed current is finished, ratio of change ΔB in electrolytic solution concentration caused by the charging/discharging can be calculated with reference to map 221.

Figure 8:
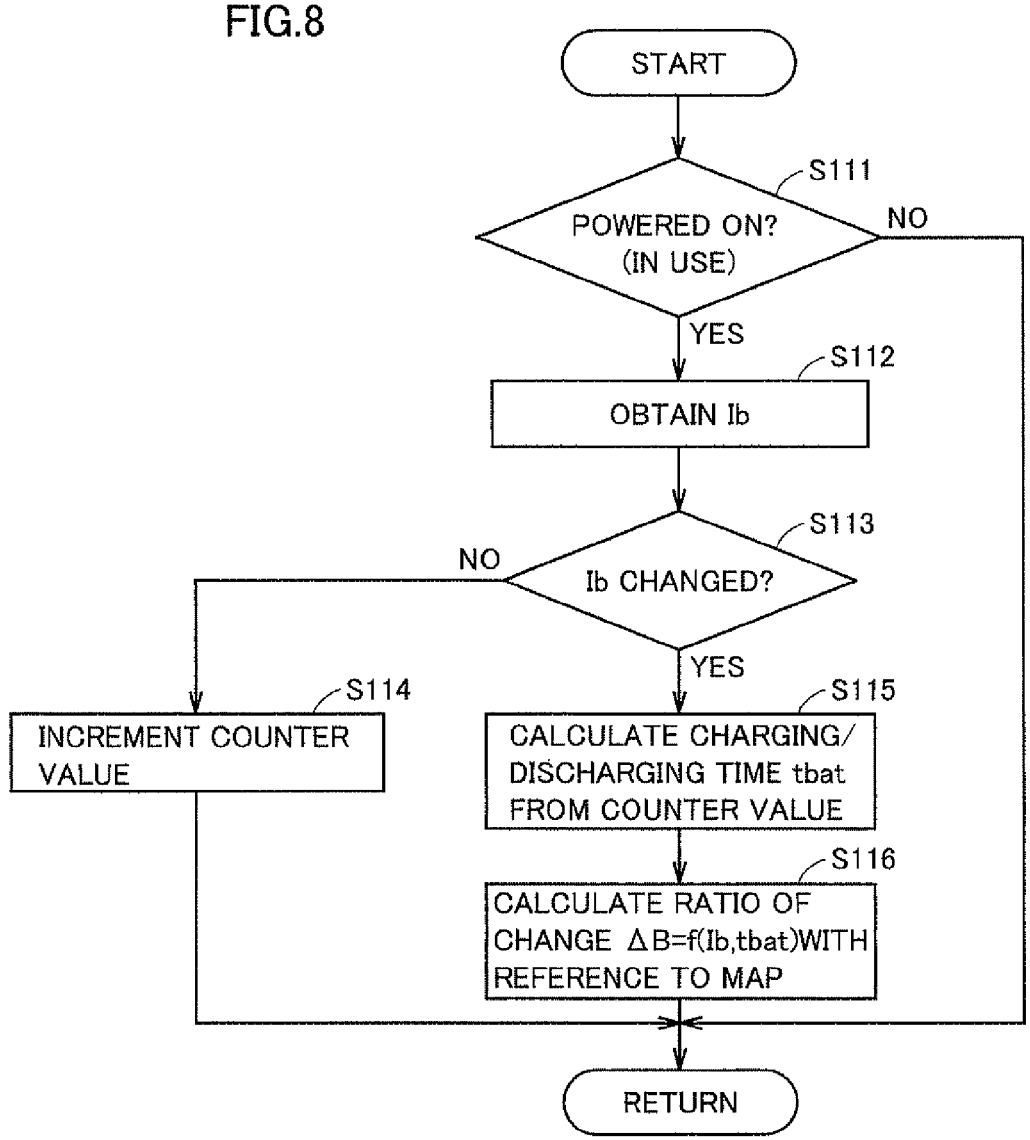
FIG. 8 is a flowchart illustrating a control structure of a subroutine for implementing operations of a concentration change ratio estimating unit shown in FIG. 6 through software processing performed by a battery ECU.

FIG. 8 is a flowchart illustrating a control structure of a subroutine for implementing operations of concentration change ratio estimating unit 210 through software processing performed by battery ECU 310.

Referring to FIG. 8, in a step S111, battery ECU 310 determines based on the PON signal whether or not the power is on, i.e., the secondary battery is in use. If the secondary battery is in a period of no use (NO in S111), the subroutine is terminated without terminating the following processing, On the other hand, if the secondary battery is in use (YES in S111), in a step S112, battery ECU 310 obtains battery current Ib at present. Then, in a step S113, battery ECU 310 compares it with that at the previous execution of the subroutine and determines whether or not an amount of change in battery current Ib is equal to or smaller than a predetermined value. In other words, in step S113, whether or not charging/discharging with the fixed current is continued is determined.

If NO is determined in step S113, i.e., if battery current Ib has not been changed, battery ECU 310 determines that charging/discharging with the fixed current is continuing, and increments in a step S114 a counter value for measuring duration time of the charging/discharging.

On the other hand, if YES is determined in step S113, i.e., if battery current Ib has been changed from that at the previous execution of the subroutine, battery ECU 310 determines that the charging/discharging with the fixed current has been ended, and performs processing of steps S115, S116 to estimate ratio of change ΔB in electrolytic solution concentration caused by the charging/discharging.

Based on the counter value counted thus far in step S114, battery ECU 310 calculates in step S115 time that of charging/discharging with the fixed current. In step S116, it makes reference to map 221 constructed based on current Ib for the charging/discharging and the charging/discharging time calculated in step S115, in order to calculate ratio of change ΔB=f(Ib, tbat). In this way, whenever one event of charging/discharging with the fixed current is ended, ratio of change ΔB in electrolytic solution concentration caused by the charging/discharging is calculated.

It should be noted that the characteristics shown in FIG. 7 may be set after conducting an experiment for each battery temperature Tb. In this case, map 221 is configured to calculate ratio of change ΔB=f(Ib, Tb, tbat) as a map value according to charging/discharging current Ib, charging/discharging time tbat, and battery temperature Tb.

Alternatively, since ratio of change ΔB may change according to an electrolytic solution concentration level at a certain time, in order to accommodate such a change, map 221 may be configured to calculate ratio of change ΔB=f(Ib, tbat, B#) according to charging/discharging current Ib, charging/discharging time tbat, and electrolytic solution concentration estimated value B# at the time, with electrolytic solution concentration levels being assigned in advance and the characteristics in FIG. 7 being found.

As such, concentration change ratio estimating unit 210 can be configured so that ratio of change ΔB in electrolytic solution concentration caused by the charging/discharging is calculated based on at least charging/discharging current Ib and charging/discharging time tbat or is calculated while reflecting, in addition to these, battery temperature Tb and/or electrolytic solution concentration estimated value B# at the start of the charging/discharging.

Figure 9:
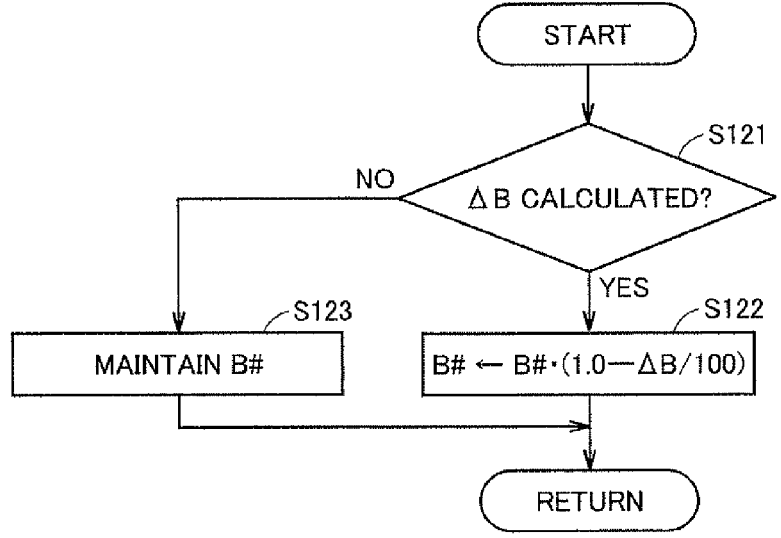
FIG. 9 is a flowchart illustrating a control structure of a subroutine for implementing operations of a concentration estimated value calculating unit shown in FIG. 6 through software processing performed by the battery ECU.

FIG. 9 is a flowchart illustrating a control structure of a subroutine for implementing operations of concentration estimated value calculating unit 230 shown in FIG. 6 through software processing.

Referring to FIG. 9, in a step S121, battery ECU 310 determines whether or not concentration change ratio estimating unit 210 has calculated ratio of change ΔB. As described above, ratio of change ΔB is calculated for every one event of ending charging/discharging with the fixed current. Hence, while the charging/discharging with the fixed current is continued, ratio of change ΔB is not calculated and therefore NO is determined in step S121. When NO is determined in step S121, battery ECU 310 maintains electrolytic solution concentration estimated value B# at present (step S123).

On the other hand, if concentration change ratio estimating unit 210 has calculated ratio of change ΔB (YES in S121), i.e., if the charging/discharging with the fixed current has been ended, battery ECU 310 reflects in step S122 calculated ratio of change ΔB, to update electrolytic solution concentration estimated value B#.

In this way, whenever charging/discharging with the fixed current is ended, a change in electrolytic solution concentration caused by the charging/discharging can be estimated and electrolytic solution concentration estimated value B# can be updated one after another.

It should be noted that concentration change ratio estimating unit 210 (map 221) can be configured to estimate amount of change ΔBb in electrolytic solution concentration instead of ratio of change ΔB in electrolytic solution concentration. In this case, in the processing in step S112 in FIG. 9, calculation of adding ΔBb to electrolytic solution concentration estimated value B# at present is performed for updating.

Alternatively, ratio of change ΔB calculated from map 221 can be defined corresponding to a product of the slope of a tangent of a curve representing a change of electrolytic solution concentration with time as shown in FIG. 7, and a calculation cycle T (cycle of execution of the subroutine). As such, in the subroutine shown in FIG. 8, also in step S141 performed when battery current Ib is not changed (NO in S113), ratio of change ΔB is calculated each time according to time tbat of charging/discharging with the current. As a result, in the control structure, ratio of change ΔB in electrolytic solution concentration and electrolytic solution concentration estimated value B# are calculated whenever the subroutine of each of FIGS. 8 and 9 is executed.

The following describes determining unit 250 and charging/discharging condition modifying unit 260 constituting charging/discharging control unit 202 in detail.

Figure 10:
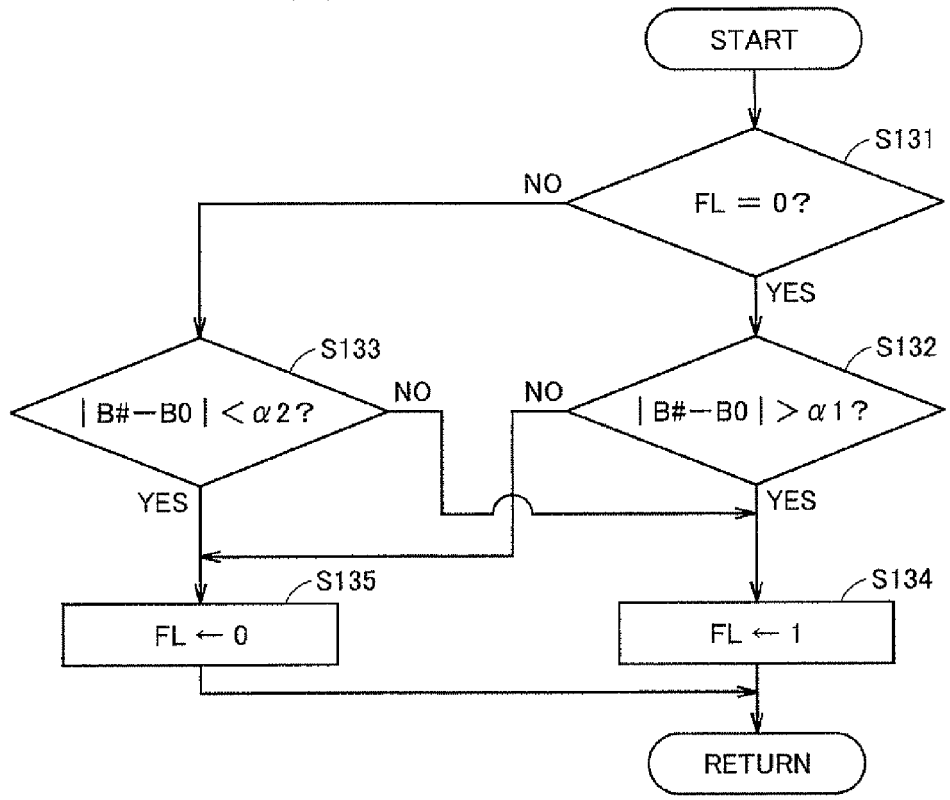
FIG. 10 is a flowchart illustrating a control structure of a subroutine for implementing operations of a determining unit shown in FIG. 6 through software processing performed by the battery ECU.

FIG. 10 is a flowchart showing a control structure of a subroutine for implementing operations of determining unit 250 shown in FIG. 6 through software processing performed by battery ECU 310.

Referring to FIG. 10, in step S131, battery ECU 310 checks a value of flag FL indicating whether or not electrolytic solution concentration is within the normal range. In the description herein, it is assumed that flag FL is set at "0" when electrolytic solution concentration is within the normal range and is set at "1" when electrolytic solution concentration is out of the normal range. It should be noted that another flag, which is not described herein, is set to indicate whether electrolytic solution concentration falling out of the normal range is too high or too low when FL=1.

When FL=0 (YES in S131), battery ECU 310 determines in a step S132 whether or not the electrolytic solution concentration at present is within the normal range, by determining whether or not electrolytic solution concentration estimated value B# estimated by concentration estimated value calculating unit 230 is changed from an initial concentration (appropriate concentration) B0 by a predetermined value or greater. Specifically, in step S132, whether $|B\#-B0|>\alpha 1$ is satisfied or not is determined, where $\alpha 1$ is a predetermined criteria value.

When $|B\#-B0|>\alpha 1$ (YES in S132), battery ECU 310 determines in a step S134 that electrolytic solution concentration is out of the normal range, and set flag FL=1.

On the other hand, when $|B\#-B0|\leq\alpha 1$ (NO in S132), battery ECU 310 determines in a step S135 that the electrolytic solution concentration is within the normal range and maintains flag FL=0.

Once it is determined that electrolytic solution concentration is out of the normal range and flag FL=1 is set, NO is determined in step S131 and battery ECU 310 determines in a step S133 whether or not the electrolytic solution concentration is brought back to the normal range, using a criteria value $\alpha 2$ different from that in step S132. Specifically, in step S133, whether $|B\#-B0|<\alpha 2$ is satisfied or not is determined. Criteria value $\alpha 2$ is set at a value smaller than criteria value $\alpha 1$ used in step S132 ($\alpha 2 < \alpha 1$). Once it is determined that the electrolytic solution concentration is out of the normal range (FL=1) and the absolute value of the amount of change in electrolytic solution concentration estimated value B# from initial concentration B0 is smaller than criteria value $\alpha 2$ (YES in S133), battery ECU 310 determines that electrolytic solution concentration is back to the normal range and update flag FL=0.

On the other hand, when NO is determined in step S133, battery ECU 310 maintains flag FL=1 in step S134.

As such, there is provided hysterisis between criteria value $\alpha 1$ for determining whether or not electrolytic solution concentration is out of the normal range and criteria value $\alpha 2$ for determining whether or not it is brought back to the normal range from outside the normal range. This can prevent charging/discharging control from being unstable by frequently modifying/stopping modifying a below-described charging/discharging condition due to frequent change (hunting) in results of determination as to whether the electrolytic solution concentration is within or out of the normal range.

Figure 11:
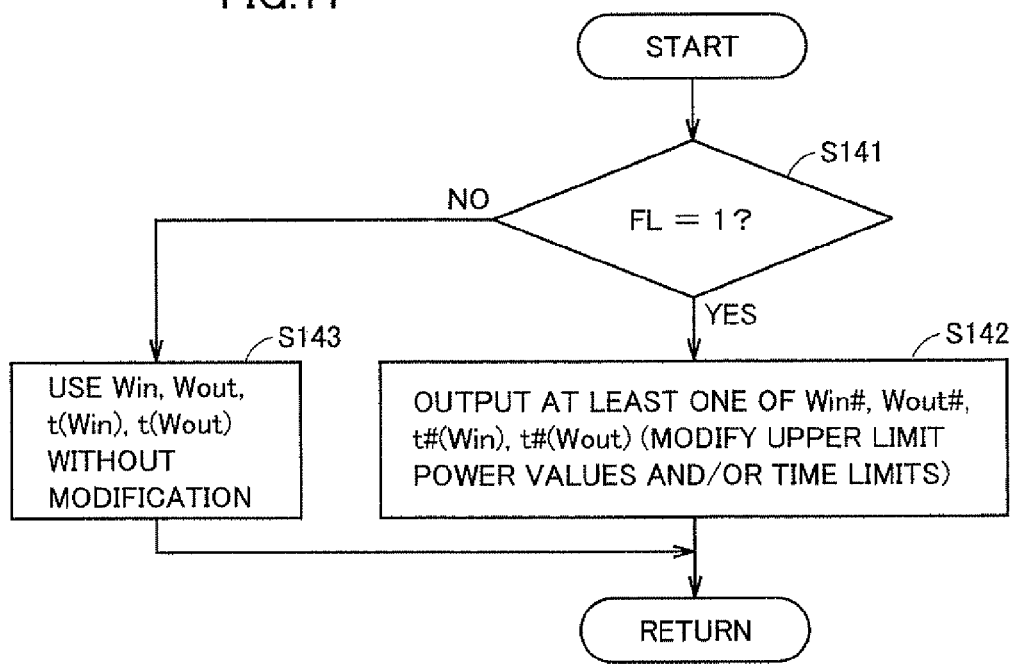
FIG. 11 is a flowchart illustrating a control structure of a subroutine for implementing operations of a charging/discharging condition modifying unit shown in FIG. 6 through software processing performed by the battery ECU.

FIG. 11 is a flowchart showing a control structure of a subroutine for implementing operations of charging/discharging condition modifying unit 260 shown in FIG. 6 through software processing performed by battery ECU 310.

Referring to FIG. 11, according to flag FL set by determining unit 250, battery ECU 310 determines in step S141 whether or not the charging/discharging condition needs to be modified. When flag FL=0 (NO in step S141), battery ECU 310 maintains the charging/discharging condition at a normal condition in a step S143. On the other hand, when flag FL=1 (YES in step S141), it modifies in a step S142 the charging/discharging condition to a condition stricter than the normal condition.

Modified in step S142 are, for example, charging power upper limit value Win and discharging power upper limit value Wout both set by battery state estimating unit 205 based on the present state of the secondary battery and indicating the limits of charging/discharging, as well as a charging time limit t(Win) and a discharging time limit t(Wout) for the upper limit values.

Now, the limits of charging/discharging power will be described.

Figure 12:
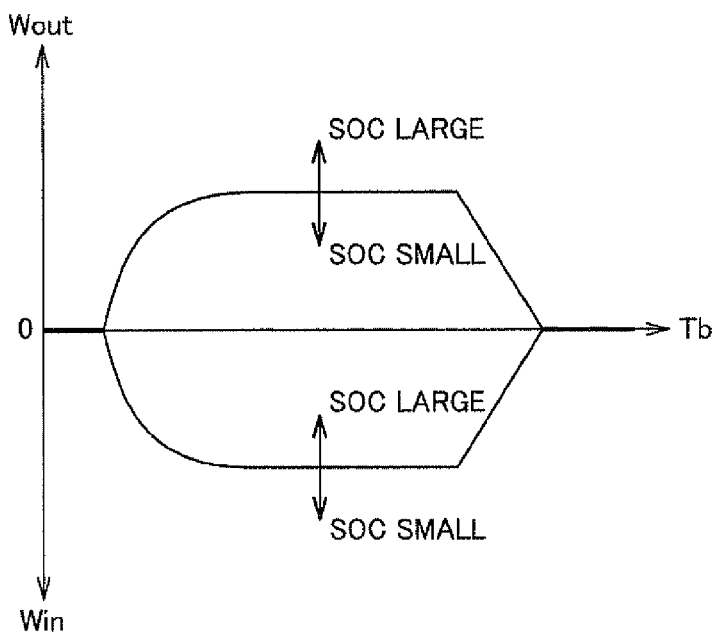
FIG. 12 is a conceptual diagram illustrating one exemplary setting of charging/discharging power upper limit values.

FIG. 12 is a conceptual diagram illustrating one exemplary setting of charging/discharging power upper limit values Win, Wout.

Referring to FIG. 12, battery state estimating unit 205 sets charging power upper limit value Win and discharging power upper limit value Wout based on battery temperature Tb and estimated SOC at the moment.

As seen from Fig. 12, in a high temperature region or a very low temperature region, charging/discharging of the secondary battery is limited as compared with that in a normal temperature region, and Win≈0 and Wout≈0 are set. As such, charging power upper limit value Win and discharging power upper limit value Wout are set variably according to battery temperature Tb and the SOC.

In FIG. 12, charging power upper limit value Win and discharging power upper limit value Wout are set symmetrically relative to battery temperature Tb (Wout=−Win), but charging power upper limit value Win and discharging power upper limit value Wout can be set arbitrarily.

Figures 13, 14:
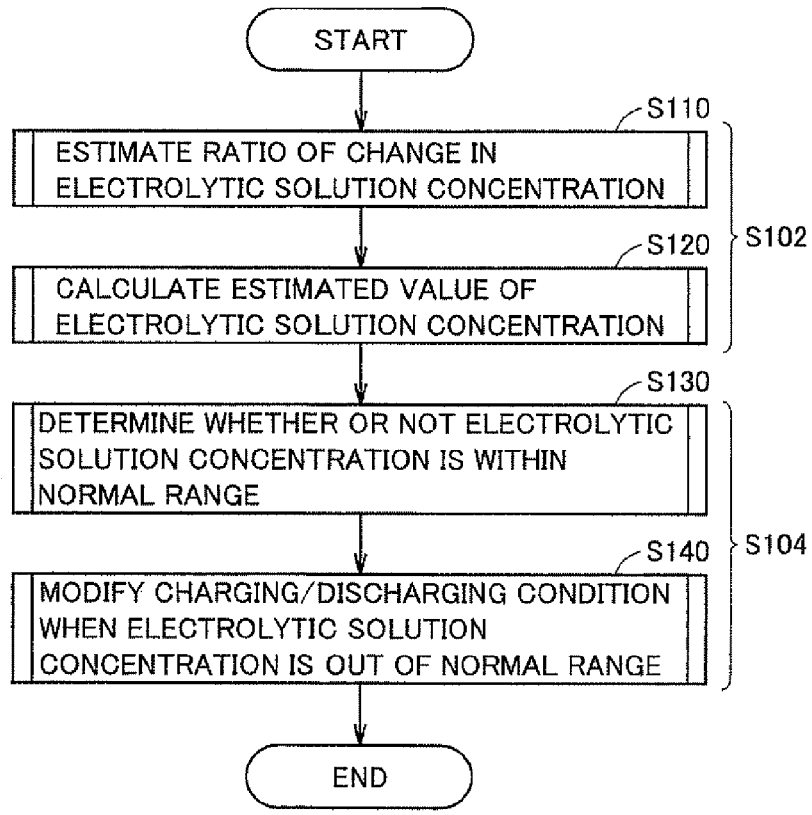
FIG. 13 shows a table illustrating types of charging/discharging power upper limit values and time limits for durations of charging/discharging with upper limit electric powers.
FIG. 14 is a flowchart showing a control structure of the control method for a secondary battery according to the embodiment of the present invention.

As shown in FIG. 13, in general, a plurality of types of charging/discharging power upper limit values Win, Wout are set. For each type, charging/discharging power upper limit values as well as time limits t(Win), t(Wout) for durations of charging/discharging with the upper limit electric powers are set.

For example, as standard rated values, charging power upper limit value Win(1) and discharging power upper limit value Wout(1) are set for t1=approximately 2-5 seconds. Further, for a very short period of time (for example, t2<approximately 1 second), short-time rated values Win(2), Wout(2) for relaxing the charging/discharging power as compared with the standard rated values to satisfy a driver's output request are set. Furthermore, to limit electric power for charging/discharging continuing for a long period of time, charging power upper limit value Win(3) and discharging power upper limit value Wout(3) are set for t3=approximately 10 seconds as continuing rated values.

In these rated values shown in FIG. 13, t2<t1<t3, |Win(3)|<|Win(1)|<|Win(2)|, and Wout(3) <Wout(1) <Wout(2). For these rated values (charging/discharging power upper limit values and time limits) for charging/discharging, a map similar to that in FIG. 12 is prepared in advance and is set according to a state of the secondary battery (for example, battery temperature and estimated SOC).

In the present embodiment, unless otherwise noted, charging power upper limit value Win and discharging power upper limit value Wout are also intended to encompass Win(1)-Win(3) and Wout(1)-Wout(3) respectively. Likewise, time limits t(Win), t(Wout) for durations of charging/discharging are also intended to encompass t1-t3, Referring to FIG. 11 again, when flag FL=0, in step S143, battery ECU 310 employs charging/discharging rated values Win, Wout, t(Win), t(Wout) set by battery state estimating unit 205 and shown in FIGS. 12 and 13, without modification.

On the other hand, when flag FL=1, battery ECU 310 modifies at least one of Win, Wout, t(Win), and t(Wout) in step S142.

As described above, when flag FL=1, determining unit 250 further provides information indicating whether the electrolytic solution concentration is increased too much or is decreased too much.

Based on the information, when the electrolytic solution concentration is increased to go out of the normal range, battery ECU 310 modifies charging power upper limit value Win (at least one of Win(1)-(3)) to Win# to decrease the absolute value thereof, thus avoiding the tendency of overcharge. Alternatively, the tendency of overcharge can be avoided by modifying time limit t(Win) for the upper limit electric power to t#(Win) so as to make the time limit shorter than usual. Alternatively, both charging power upper limit value Win and time limit t(Win) may be modified.

On the other hand, when the electrolytic solution concentration is decreased to go out of the normal range, battery ECU 310 modifies discharging power upper limit value Wout (at least one of Wout(1)-(3)) to Wout# to decrease the absolute value thereof, thus avoiding the tendency of overdischarge. Alternatively, the tendency of overdischarge may be avoided by modifying time limit t(Wout) for the upper limit electric power to t#(Wout) so as to make the time limit shorter than usual, Alternatively, both discharging power upper limit value Wout and time limit t(Wout) may be modified.

In this way, by modifying the charging/discharging power upper limit values and/or the time limits for the charging/discharging with the upper limit electric power, the charging/discharging condition of the secondary battery can be modified to bring back to the normal range the electrolytic solution concentration having fallen out of the normal range, thus avoiding the tendency of overcharge or overdischarge.

It should be noted that the modification of the charging/discharging condition by charging/discharging condition modifying unit 260 is not limited to the change of the above-described limits of charging/discharging (charging/discharging power upper limit values and/or time limits for charging/discharging with the upper limit electric power). For example, the charging/discharging condition of the secondary battery can be modified to avoid the tendency of charging or discharging the secondary battery too much, by modifying a charging current level in a mode of charging traveling battery 220 using electric power generated by generator 140B through an output of engine 120, or by modifying the distribution of driving powers between engine 120 and motor 140A during traveling of the vehicle.

As described above, in the control system for a secondary battery according to the present embodiment, the charging/discharging condition of the secondary battery can be modified based on the use state of the secondary battery. Specifically, a change in electrolytic solution concentration caused by use (charging/discharging) of the secondary battery is estimated, and when the electrolytic solution concentration thus estimated is out of the normal range, the charging/discharging condition can be modified to bring the electrolytic solution concentration back to the normal range. Therefore, by controlling charging/discharging of the secondary battery to maintain the electrolytic solution concentration within the normal range, progress of deterioration of the secondary battery can be prevented before occurrence of noticeable deterioration such as increase of internal resistance, thus achieving longer life thereof.

It should be noted that the control system of the secondary battery shown in FIG. 6 can be implemented in software by battery ECU 310 through a combination of the subroutines shown in FIGS. 8, 9, 10, and 11, in accordance with the flowchart shown in FIG. 14.

Referring to FIG. 14, the control method for a secondary battery according to the embodiment of the present invention includes: step S102 of estimating electrolytic solution concentration based on a use state of the secondary battery; and step S104 of controlling charging/discharging of the secondary battery based on the electrolytic solution concentration thus estimated, to maintain the electrolytic solution concentration within the normal range. Step S102 includes: step S110 of estimating a ratio of change in electrolytic solution concentration by executing the subroutine shown in FIG. 8; and step S120 of sequentially calculating an estimated value of the electrolytic solution concentration by executing the subroutine shown in FIG. 9.

Similarly, step S104 includes: step S130 of determining whether or not the electrolytic solution concentration is within the normal range by executing the subroutine shown in FIG. 10; and step S140 of modifying the charging/discharging condition to bring the electrolytic solution concentration back to the normal range by executing the subroutine shown in FIG. 11 when it is determined that the electrolytic solution concentration is out of the normal range.

Namely, the processing in step S110 corresponds to the operation of concentration change ratio estimating unit 210 in FIG. 6, the processing in step S120 corresponds to the operation of concentration estimated value calculating unit 230 in FIG. 6, the processing in step S130 corresponds to the operation of determining unit 250 in FIG. 6, and the processing in step S140 corresponds to the operation of charging/discharging condition modifying unit 260 in FIG. 6. As such, a predetermined program stored in advance in battery ECU 310 to implement the flowchart shown in FIG. 14 is executed at a predetermined cycle, whereby the control system shown in FIG. 6 implements control for charging/discharging the secondary battery.

First Variation

In a first variation, a variation of the configuration of electrolytic solution concentration estimating unit 202 shown in FIG. 6 will be described.

Figure 15:
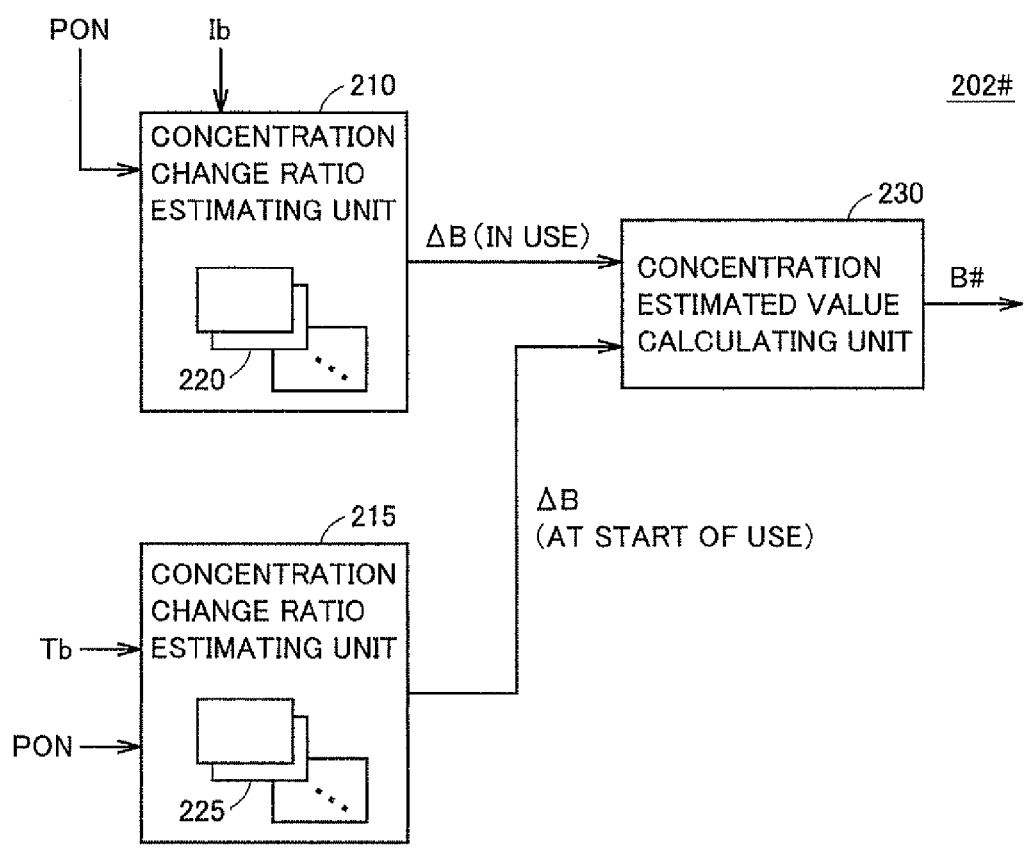
FIG. 15 is a schematic block diagram showing a concentration estimating unit of a first variation of the embodiment of the present invention.

Referring to FIG. 15, an electrolytic solution concentration estimating unit 202# according to the first variation of the embodiment of the present invention is different from the configuration of electrolytic solution concentration estimating unit 202 shown in FIG. 6, in that it further includes a concentration change ratio estimating unit 215 for estimating ratio of change $\Delta B$ in electrolytic solution concentration during a non-use period of the secondary battery (for example, an off period of the power switch, i.e., an off period of the PON signal).

Ratio of change $\Delta B$ in electrolytic solution concentration estimated by concentration change ratio estimating unit 215 is transmitted to concentration estimated value calculating unit 230 at the start of using the secondary battery (for example, when OFF→ON of the PON signal). Concentration change ratio estimating unit 215 includes a map 225 for calculating ratio of change $\Delta B$ in electrolytic solution concentration during the non-use period of the secondary battery. Map 225 is configured to reflect such a characteristic that the electrolytic solution concentration is changed to get closer to initial concentration BO during the non-use period of the secondary battery due to an effect of relaxation of the secondary battery.

As known well, the effect of relaxation of the secondary battery is greatly influenced by battery temperature Tb. Hence, based on results of previously conducted experiments, map 225 is configured so that ratio of change $\Delta B=g(Tbst, tst)$ is extracted as a map value in accordance with battery temperature Tbst and relaxation time, i.e., non-use time tst of the secondary battery, during the non-use period of the secondary battery (relaxation period). In this way, whenever the secondary battery starts to be used, ratio of change $\Delta B$ in electrolytic solution concentration during the non-use period of the secondary battery can be estimated.

When ending the use of the secondary battery (ON→OFF of the PON signal), concentration estimated value calculating unit 230 causes a nonvolatile memory region not shown in the figures to store electrolytic solution concentration estimated value B# at the moment. When starting to use the secondary battery (OFF→ON of the PON signal), concentration estimated value calculating unit 230 calculates an electrolytic solution concentration estimated value B# at the start of use thereof according to electrolytic solution concentration estimated value B# stored in the nonvolatile memory region and ratio of change $\Delta B$ having occurred during the non-use period and provided from concentration change ratio estimating unit 215.

Figure 16:
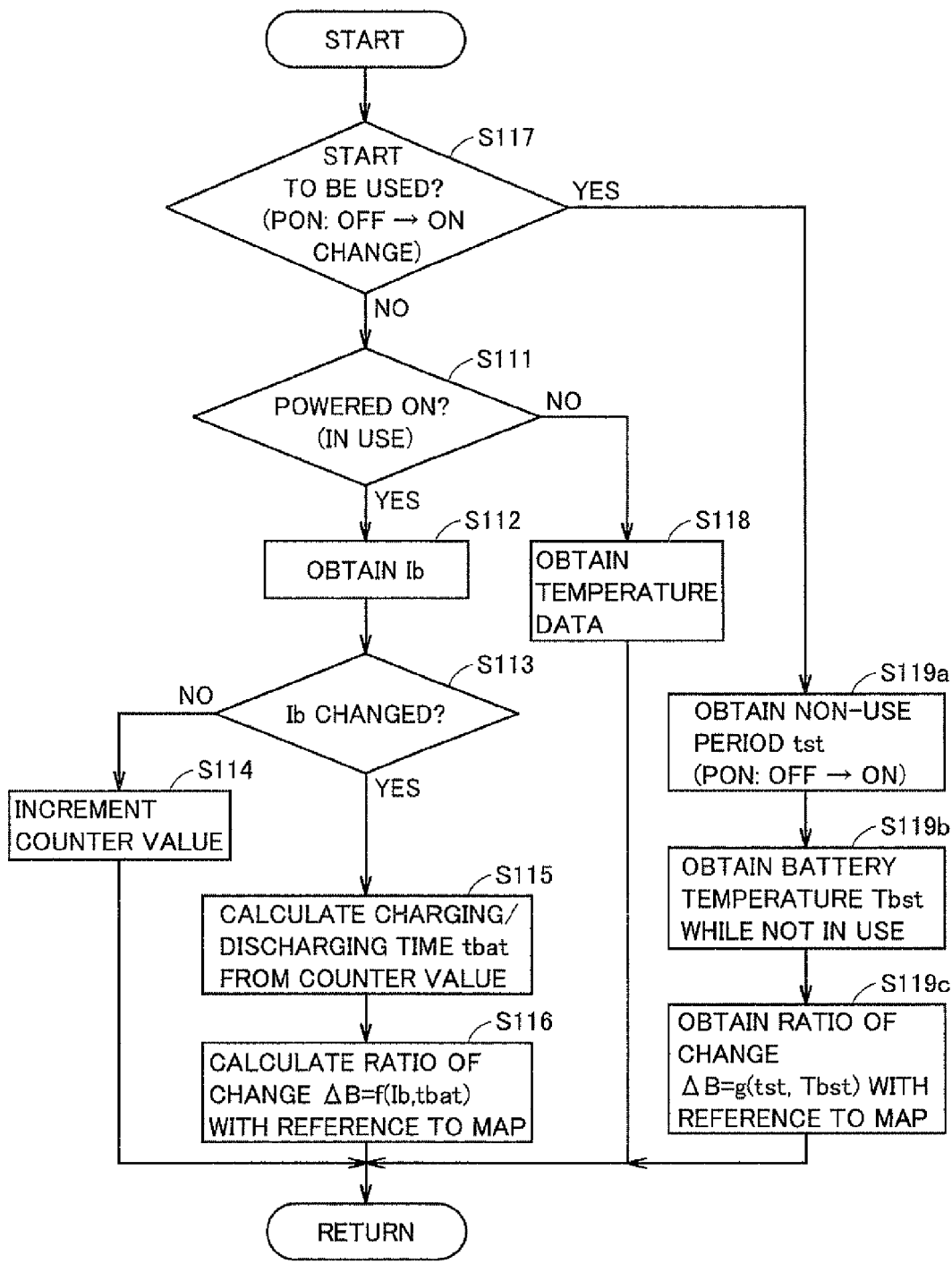
FIG. 16 is a flowchart illustrating a control structure of a subroutine for implementing operations of a concentration change ratio estimating unit shown in FIG. 15 through software processing performed by the battery ECU.

In this way, the change in electrolytic solution concentration caused by the effect of relaxation during the non-use period of the secondary battery (change toward initial concentration B0) can be also reflected, whereby the electrolytic solution concentration can be estimated more accurately, FIG. 16 is a flowchart showing a control structure of a subroutine executed instead of the subroutine of FIG. 8 to implement operations of concentration change ratio estimating unit 210 and concentration change ratio estimating unit 215 through software processing performed by battery ECU 310.

Referring to FIG. 16, for estimation of the ratio of change in concentration in the first variation of the embodiment of the present invention, battery ECU 310 performs steps S117, S118, S119a-S119c in addition to steps S111-S116 shown in the flowchart of FIG. 8.

Prior to step S111, battery ECU 310 performs step S117 to detect start of use of the secondary battery, i.e., to detect transition of the PON signal from off to on. When NO is determined in step S117, i.e., at a time other than the start of use of the secondary battery, battery ECU 310 performs steps Sill to S116 as with those in FIG. 8. When NO is determined in step S111, i.e., during the non-use period of the secondary battery, battery ECU 310 performs step S118 to periodically obtain temperature data for battery temperature Tb. Alternatively, if the ECU is designed not to obtain a trigger for measuring battery temperature Tb during the non-use time of the secondary battery, step S118 may not be performed.

Meanwhile, when YES is determined in step S117, i.e., at the start of use of the secondary battery, battery ECU 310 performs processing of steps S119a-S119c.

In step S119a, battery ECU 310 obtains non-use time tst of the secondary battery based on the passage of time from the moment that the PON signal has become off to the moment that the PON signal has become on. Further, in step S119b, battery ECU 310 obtains battery temperature Tbst during the non-use time of the secondary battery based on, for example, the temperature data obtained in step S118. It should be noted that if the temperature data cannot be obtained during the non-use period of the secondary battery, battery temperature Tbst during the non-use period can be estimated based on battery temperature Tb at the moment that the PON signal has become off; battery temperature Tb at present, and optionally a temperature of external air.

Further, battery ECU 310 performs step S119c to obtain ratio of change $\Delta B=g(Tbst, tst)$ according to at least non-use time tst and battery temperature Tbst during the non-use period through processing similar to that of making reference to map 225 of FIG. 15, based on an actual measurement value of the previously experimented effect of relaxation and the like.

In this way, ratio of change $\Delta B$ in electrolytic solution concentration during the non-use period of the battery is calculated at the start of use of the secondary battery. At the start of use of the secondary battery, the subroutine shown in FIG. 9 determines YES in step S121 in response to the calculation of ratio of change $\Delta B$. Hence, at the start of use of the secondary battery, the effect of relaxation during the non-use period of the secondary battery can be reflected in calculation of electrolytic solution concentration estimated value B#. As such, the estimation of electrolytic solution concentration according to the first variation of the present embodiment also can be implemented through software processing performed by battery ECU 310.

In the first variation of the present embodiment, concentration change ratio estimating unit 215 (map 225) can be configured to estimate amount of change $\Delta Bb$ in electrolytic solution concentration instead of ratio of change $\Delta B$ in electrolytic solution concentration.

Second Variation

Described in a second variation is a variation of determining unit 250 shown in FIG. 6 for determining whether or not the electrolytic solution concentration is within the normal range.

Figure 17:
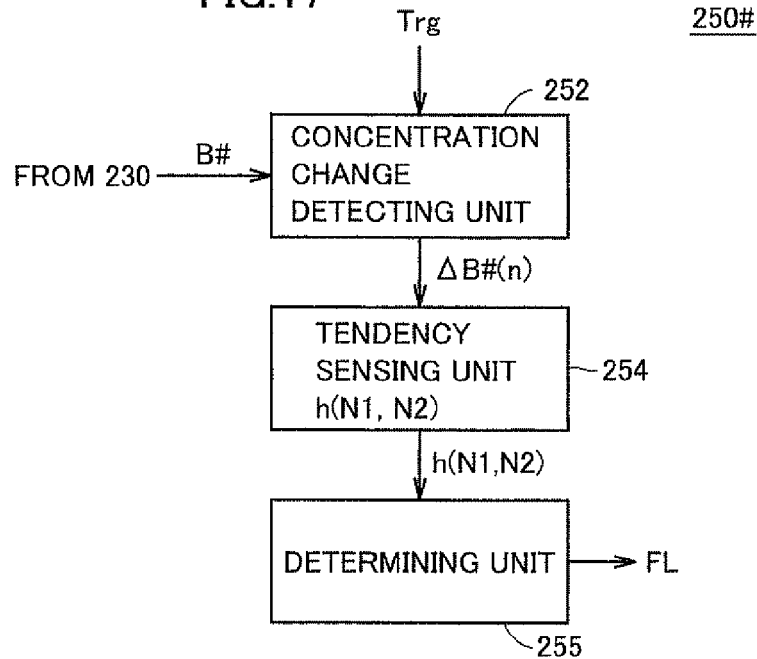
FIG. 17 is a block diagram showing a determining configuration according to a second variation of the embodiment of the present invention.

FIG. 17 is a block diagram showing a determining configuration 250# of the second variation of the embodiment of the present invention.

Referring to FIG. 17, determining configuration 250# includes a concentration change detecting unit 252, a tendency sensing unit 254, and a determining unit 255.

Concentration change detecting unit 252 receives an electrolytic solution concentration estimated value B# from concentration estimated value calculating unit 230, and a trigger signal Trg indicating passage of a predetermined period.

Trigger signal Trg is generated whenever the predetermined period has passed or hybrid vehicle 100 has traveled for a predetermined distance, during the use period of the secondary battery, i.e., during the period of traveling of hybrid vehicle 100. Alternatively, trigger signal Trg may be generated in response to on/off of the power switch of the hybrid vehicle. In this way, the predetermined period corresponds to one trip of the hybrid vehicle (start of driving to end of driving).

Whenever each predetermined period passes, concentration change detecting unit 252 calculates an amount of change $\Delta B\#(n)$ in concentration, which is defined by a difference between an initial value (at the start of the predetermined period) and a final value (at the end of the predetermined period) of electrolytic solution concentration estimated value B#. Here, n represents a value incremented by one whenever a predetermined period starts.

Figure 18:
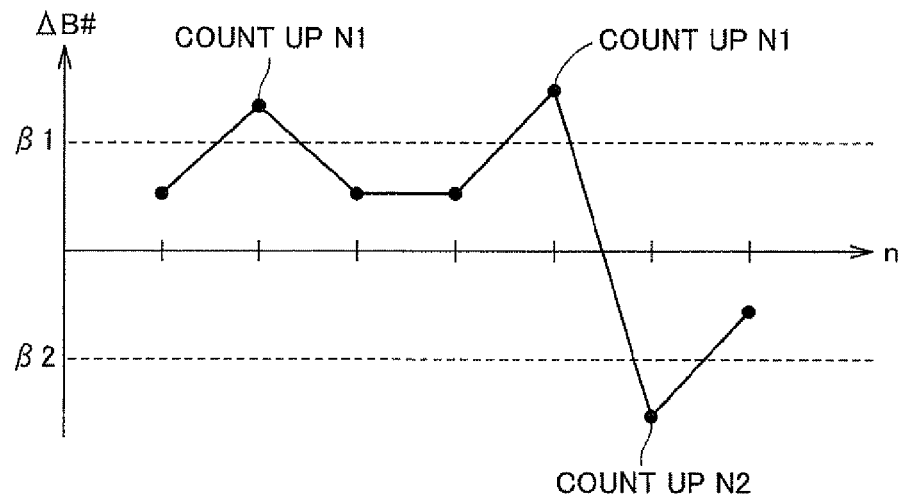
FIG. 18 is a conceptual diagram illustrating how to figure out a tendency of usage of the secondary battery using a tendency sensing unit shown in FIG. 17.

As shown in FIG. 18, tendency sensing unit 254 calculates a count value NI and a count value N2 based on amount of change $\Delta B\#(n)$ in concentration during each predetermined period. During the predetermined period, count value N1 is counted up whenever the electrolytic solution concentration is increased to go above a predetermined criteria value $\beta 1$ whereas count value N2 is counted up whenever the electrolytic solution concentration is decreased to go below a criteria value β2.

Based on count values N1 and N2, tendency sensing unit 254 calculates a tendency management values h(N1, N2) indicating a tendency of use of the secondary battery. Tendency management value h(N1, N2) is expressed by, for example, N1/N or N2/N, which indicates in probability how frequent the electrolytic solution concentration goes above or below criteria values β1, β2. Here, N represents a natural number indicating the total of the predetermined periods.

Determining unit 255 determines a flag FL based on tendency management value h(N1, N2) found by tendency sensing unit 254. As with that in determining unit 250, flag FL=0 is set when it is determined that the electrolytic solution concentration is within the normal range, and flag FL=1 is set when it is determined that the electrolytic solution concentration is out of the normal range and the charging condition needs to be modified.

For example, when probability N1/N goes above the predetermined criteria value, determining unit 255 can detect a tendency in which the secondary battery is used to increase the electrolytic solution concentration, i.e., tendency of usage toward overcharge. On the other hand, when probability N2/N goes below the predetermined criteria value, determining unit 255 can detect a tendency in which the secondary battery is used to decrease the electrolytic solution concentration, i.e., a tendency of usage toward overdischarge.

Alternatively, when a probability (N1-N2)/N found based on a difference between count values N1 and N2 is employed as tendency management value h(N1, N2), an overall tendency of usage can be figured out while canceling the periods during which the electrolytic solution concentration is increased too much and is decreased too much. On this occasion, by using a weighting coefficient to employ tendency management value h(N1, N2)=(k1·N1-k2·N2)/N or by using different criteria values for the probabilities N1/N and N2/N, the overall tendency of usage can be also figured out to cancel a tendency of error in estimation done by electrolytic solution concentration estimating unit 202.

As such, amount of change ΔB#(n) in concentration of the electrolytic solution is found one after another for each predetermined period, and the tendency of usage of the secondary battery is figured out by tendency management value h(N1, N2), whereby it can be detected whether the tendency of usage of the secondary battery is a tendency toward overcharge or a tendency toward overdischarge before electrolytic solution concentration estimated value B# is changed from initial concentration B0 to exceed criteria value α1 (FIG. 10).

In this way, according to the tendency of usage of the secondary battery, i.e., the characteristics of the driver who drives hybrid vehicle 100, the modification of the charging/discharging condition in the present embodiment can be started to prevent the electrolytic solution concentration from increasing or decreasing too much. As a result, the secondary battery can be prevented more effectively from deteriorating due to increase or decrease of the electrolytic solution concentration.

FIG. 19 is a flowchart showing a control structure of a subroutine executed instead of the subroutine of FIG. 10 to implement operations of determining configuration 250# shown in FIG. 17 through software processing performed by battery ECU 310.

Referring to FIG. 19, for the determinations in the second variation of the embodiment of the present invention, battery ECU 310 performs steps S136-S139 in addition to steps S131-S135 shown in the flowchart of FIG. 10. The determinations by steps S132, S133 are replaced with determinations by steps S132#, S133#.

In step 5136, battery ECU 310 determines, in response to trigger signal Trg shown in FIG. 17, whether or not a predetermined period has been ended. If NO is determined in step S136, i.e., while the predetermined period has not been ended yet, the present value of flag FL is maintained in step S139.

On the other hand, if YES is determined in step S136, i.e., whenever each predetermined period ends, battery ECU 310 calculates in step S137 amount of change ΔB#(n) in concentration of the electrolytic solution during the predetermined period. In step S138, battery ECU 310 calculates tendency management value h(N1, N2) according to count values N1, N2 found based on amounts of change ΔB#(1)-ΔB#(N) in concentration during each predetermined period.

In step S132#, battery ECU 310 determines whether to change FL from 0 to 1, based on whether or not tendency management value h(N1, N2) calculated in step S138 exceeds a criteria value A1. Once tendency management value h(N1, N2) reaches or goes below a criteria value A2 (A2 <A1) after flag FL=1 is set, battery ECU 310 sets flag FL=0 again in step S1334.

As such, there is provided hysteresis between criteria value A1 for determining whether or not the electrolytic solution concentration falls out of the normal range and criteria value A2 for determining whether or not the electrolytic solution concentration comes back to the normal range from outside the normal range. Hence, as with the flowchart in FIG. 10, control for charging/discharging can be prevented from being unstable by frequent changes (hunting) in the results of determination as to whether the electrolytic solution concentration is inside/outside the normal range and by accordingly frequently modifying/stopping modifying the charging/discharging condition according to the present embodiment. As such, the determination according to the second variation of the present embodiment as to whether the electrolytic solution concentration is inside/outside the normal range can be also implemented through software processing performed by battery ECU 310.

It should be noted that in the present embodiment and the variations thereof, a lithium ion secondary battery is illustrated as the secondary battery constituting traveling battery 220, but a battery other than a lithium ion secondary battery is also applicable to the control system and control method for a secondary battery according to the embodiment of the present invention and the variation thereof as long as the battery is of a type having the characteristics shown in FIGS. 4 and 5.

Further, in the embodiment of the present invention and the variations thereof, the electrically powered vehicle illustrated as hybrid vehicle 100 may be a hybrid vehicle, an electric car having no internal combustion engine, or a fuel cell car having a fuel cell for generating electric energy using fuel.

It should be also noted that in the description above, the software processing by battery ECU 310 is actually executed by a CPU (Central Processing Unit) not shown in the figures, and the CPU can be configured to read out from a ROM (Read Only Memory) a program including each of the steps described in the illustrated flowcharts, and execute the read-out program to perform processing according to the flowcharts. Hence, the ROM corresponds to a computer (CPU) readable storage medium storing thereon the program including each of the steps of the flowcharts described in each embodiment.

Although the present invention has been described and illustrated in detail, it is clearly understood that the same is by way of illustration and example only and is not to be taken by way of limitation, the scope of the present invention being interpreted by the terms of the appended claims.

The invention claimed is:

1. A control system for a secondary battery configured to exchange electric power with a load, said secondary battery including first and second electrodes each configured to include an active material containing a predetermined material, and an ionic conductor for conducting said predetermined material which is ionized between said first and second electrodes, the control system comprising:

a concentration estimating unit configured to estimate an electrolyte ion concentration in an electrolytic solution of said ionic conductor based on a use state of said secondary battery; and a charging/discharging control unit for controlling charging/discharging of said secondary battery based on an estimated value of said electrolyte ion concentration provided by said concentration estimating unit, so as to maintain said electrolyte ion concentration within a normal range, said concentration estimating unit including a first change ratio estimating unit configured to calculate an estimated value of a ratio of change in said electrolyte ion concentration in accordance with a previously found characteristic regarding a change in said electrolyte ion concentration relative to a charging/discharging current and a charging/discharging time in charging/discharging said secondary battery with a fixed current, based on said charging/discharging current and said charging/discharging time of said secondary battery with said charging/discharging current, and a concentration estimated value calculating unit configured to sequentially obtain said estimated value of said electrolyte ion concentration by accumulating a change in said electrolyte ion concentration caused by use of said secondary battery, according to said estimated value of said ratio of change calculated by said first change ratio estimating unit.

2. The control system for a secondary battery according to claim 1, wherein said first change ratio estimating unit is configured to make reference to a map storing a previously determined relation among said charging/discharging current, said charging/discharging time, and said ratio of change, so as to obtain said estimated value of said ratio of change for each charging/discharging of said secondary battery based on said charging/discharging current and said charging/discharging time.

3. The control system for a secondary battery according to claim 1, wherein said first change ratio estimating unit is configured to make reference to a map storing a previously determined relation among said charging/discharging current, said charging/discharging time, and said ratio of change for each electrolyte ion concentration, so as to obtain said estimated value of said ratio of change for each charging/discharging of said secondary battery, based on said electrolyte ion concentration, said charging/discharging current, and said charging/discharging time at the time of charging/discharging.

4. The control system for a secondary battery according to claim 1, wherein:

said concentration estimating unit further includes a second change ratio estimating unit configured to calculate said estimated value of said ratio of change in said electrolyte ion concentration caused by relaxation of said secondary battery during a non-use period in which the charging/discharging of said secondary battery is stopped, at least based on a temperature of said secondary battery and a length of said non-use period, said concentration estimated value calculating unit is configured to calculate said estimated value of said electrolyte ion concentration at a start of use of said secondary battery based on said estimated value of said ratio of change calculated by said second change ratio estimating unit.

5. The control system for a secondary battery according to claim 1, wherein said charging/discharging control unit includes a determining unit configured to determine that said electrolyte ion concentration is outside the normal range when a difference between said estimated value of said electrolyte ion concentration provided by said concentration estimating unit and an initial value of said electrolyte ion concentration is greater than a first predetermined value, and a charging/discharging condition modifying unit configured to modify a charging/discharging condition of said secondary battery to bring said electrolyte ion concentration back to said normal range when said determining unit determines that said electrolyte ion concentration is outside the normal range.

6. The control system for a secondary battery according to claim 5, wherein:

said determining unit is configured to determine that said electrolyte ion concentration is brought back to said normal range, when said difference between said estimated value of said electrolyte ion concentration and said initial value of said electrolyte ion concentration is brought to be smaller than a second predetermined value ($\alpha 2$) smaller than said first predetermined value after said determining unit has determined that said electrolyte ion concentration is outside said normal range, and said charging/discharging condition modifying unit is configured to stop modifying said charging/discharging condition when said determining unit determines that said electrolyte ion concentration is brought back to said normal range.

7. The control system for a secondary battery according to claim 1, wherein:

said charging/discharging control unit includes a concentration change detecting unit configured to obtain, for each predetermined period, an amount of change in said estimated value of said electrolyte ion concentration during the predetermined period, a tendency sensing unit configured to calculate, based on said amount of change found by said concentration change detecting unit, a first frequency indicating how frequent said electrolyte ion concentration reaches/goes above a predetermined value, and a second frequency indicating how frequent said electrolyte ion concentration reaches/goes below a predetermined value, a determining unit configured to determine that said electrolyte ion concentration is outside the normal range when said first frequency and said second frequency calculated by said tendency sensing unit satisfy a first predetermined condition, and a charging/discharging condition modifying unit configured to modify a charging/discharging condition of said secondary battery to bring back said electrolyte ion concentration to said normal range when said determining unit determines that said electrolyte ion concentration is outside the normal range.

8. The control system for a secondary battery according to claim 7, wherein said predetermined period is a period of time with a fixed length.

9. The control system for a secondary battery according to claim 7, wherein said predetermined period corresponds to a period of time from start of driving of said load to end of the driving.

10. The control system for a secondary battery according to claim 7, wherein:
said determining unit is configured to determine that said electrolyte ion concentration is brought back to said normal range when said first frequency and said second frequency calculated by said tendency sensing unit satisfy a second predetermined condition after said determining unit has determined that said electrolyte ion concentration is outside said normal range, and
said charging/discharging condition modifying unit is configured to stop modifying said charging/discharging condition when said determining unit determines that said electrolyte ion concentration is brought back to said normal range.

11. The control system for a secondary battery according to claim 1, wherein:
said charging/discharging control unit includes
a determining unit configured to determine whether or not said electrolyte ion concentration is within said normal range, in accordance with said estimated value of said electrolyte ion concentration provided by said concentration estimating unit, and
a charging/discharging condition modifying unit configured to make a predetermined time relatively shorter than that when said electrolyte ion concentration is within the normal range, in limiting the charging/discharging by setting a first electric power and a second electric power able to be continuously input and output to and from said secondary battery over said predetermined time, when said determining unit determines that said electrolyte ion concentration is outside the normal range.

12. The control system for a secondary battery according to claim 1, wherein:
said charging/discharging control unit includes
a determining unit configured to determine whether or not said electrolyte ion concentration is within said normal range, in accordance with said estimated value of said electrolyte ion concentration provided by said concentration estimating unit, and
a charging/discharging condition modifying unit configured to decrease an absolute value of at least one of a first electric power and a second electric power able to be continuously input and output to and from said secondary battery over a predetermined time, as compared with that when said electrolyte ion concentration is within the normal range, in limiting the charging/discharging by setting said first and said second electric powers, when said determining unit determines that said electrolyte ion concentration is outside the normal range.

13. The control system for a secondary battery according to claim 1, wherein said predetermined material is lithium.

14. An electrically powered vehicle, comprising:
the control system for a secondary battery according to claim 1; and
a motor provided as said load of said control system for a secondary battery,
the electrically powered vehicle being configured such that said motor generates a vehicle driving force.

15. A method for controlling a secondary battery configured to exchange electric power with a load,
said secondary battery including
first and second electrodes each configured to include an active material containing a predetermined material, and
an ionic conductor for conducting said predetermined material which is ionized between said first and second electrodes,
the method comprising the steps of:
estimating an electrolyte ion concentration in an electrolytic solution of said ionic conductor based on a use state of said secondary battery; and
controlling charging/discharging of said secondary battery based on an estimated value of said electrolyte ion concentration provided by said step of estimating, so as to maintain said electrolyte ion concentration within a normal range,
said step of estimating including the steps of
calculating an estimated value of a ratio of change in said electrolyte ion concentration in accordance with a previously found characteristic regarding a change in said electrolyte ion concentration relative to a charging/discharging current and a charging/discharging time in charging/discharging said secondary battery with a fixed current, based on said charging/discharging current and said charging/discharging time of said secondary battery with said charging/discharging current, and
sequentially obtaining said estimated value of said electrolyte ion concentration by accumulating a change in said electrolyte ion concentration caused by use of said secondary battery, according to said estimated value of said ratio of change thus calculated.

16. The method for controlling a secondary battery according to claim 15, wherein:
in said step of calculating, said estimated value of said ratio of change is obtained for each charging/discharging of said secondary battery based on said charging/discharging current and said charging/discharging time, with reference to a map storing a previously determined relation among said charging/discharging current, said charging/discharging time, and said ratio of change.

17. The method for controlling a secondary battery according to claim 15, wherein:
in said step of calculating, said estimated value of said ratio of change for each charging/discharging of said secondary battery is obtained based on said electrolyte ion concentration, said charging/discharging current, and said charging/discharging at the time of charging/discharging, with reference to a map storing a previously determined relation among said charging/discharging current, said charging/discharging time, and said ratio of change for each electrolyte ion concentration.

18. The method for controlling a secondary battery according to claim 15, wherein:
said step of calculating includes a step of calculating said estimated value of said ratio of change in said electrolyte ion concentration caused by relaxation of said secondary battery during a non-use period in which the charging/discharging of said secondary battery is stopped, at least based on a temperature of said secondary battery and a length of said non-use period, and
in said step of sequentially obtaining said estimated value of said electrolyte ion concentration at a start of use of said secondary battery is obtained based on said estimated value of said ratio of change calculated during said non-use period.

19. The method for controlling a secondary battery according to claim 15, wherein:
said step of controlling charging/discharging includes the steps of
determining that said electrolyte ion concentration is outside the normal range when a difference between said estimated value of said electrolyte ion concentration provided by said step of estimating and an initial value of said electrolyte ion concentration is greater than a first predetermined value, and
modifying a charging/discharging condition of said secondary battery to bring said electrolyte ion concentration back to said normal range when it is determined that said electrolyte ion concentration is outside the normal range.

20. The method for controlling a secondary battery according to claim 19, wherein:
said step of determining includes a sub step of determining that said electrolyte ion concentration is brought back to said normal range, when said difference between said estimated value of said electrolyte ion concentration and said initial value of said electrolyte ion concentration is brought to be smaller than a second predetermined value smaller than said first predetermined value after it has been determined that said electrolyte ion concentration is outside said normal range, and
said step of controlling charging/discharging includes a step of stopping modifying said charging/discharging condition when said sub step of determining determines that said electrolyte ion concentration is brought back to said normal range.

21. The method for controlling a secondary battery according to claim 15, wherein:
said step of controlling charging/discharging includes the steps of
obtaining, for each predetermined period, an amount of change in said estimated value of said electrolyte ion concentration during the predetermined period,
calculating, based on said amount of change thus found, a first frequency indicating how frequent said electrolyte ion concentration reaches/goes above a predetermined value, and a second frequency indicating how frequent said electrolyte ion concentration reaches/goes below a predetermined value,
determining that said electrolyte ion concentration is outside the normal range when said first frequency and said second frequency satisfy a first predetermined condition, and
modifying a charging/discharging condition of said secondary battery to bring back said electrolyte ion concentration to said normal range when it is determined that said electrolyte ion concentration is outside the normal range.

22. The method for controlling a secondary battery according to claim 21, wherein said predetermined period is a period of time with a fixed length.

23. The method for controlling a secondary battery according to claim 21, wherein said predetermined period corresponds to a period of time from start of driving of said load to end of the driving.

24. The method for controlling a secondary battery according to claim 21, wherein:
said step of determining includes a sub step of determining that said electrolyte ion concentration is brought back to said normal range when said first frequency and said second frequency thus calculated satisfy a second predetermined condition after it has been determined that said electrolyte ion concentration is outside said normal range, and
said step of controlling charging/discharging further includes a step of stopping modifying said charging/discharging condition when said sub step of determining determines that said electrolyte ion concentration is brought back to said normal range.

25. The method for controlling a secondary battery according to claim 15, wherein:
said step of controlling charging/discharging includes the steps of
determining whether or not said electrolyte ion concentration is within said normal range, in accordance with said estimated value of said electrolyte ion concentration provided by said step of estimating, and
making a predetermined time relatively shorter than that when said electrolyte ion concentration is within the normal range, in limiting the charging/discharging by setting a first electric power and a second electric power able to be continuously input and output to and from said secondary battery over said predetermined time, when it is determined that said electrolyte ion concentration is outside the normal range.

26. The method for controlling a secondary battery according to claim 15, wherein:
said step of controlling charging/discharging includes the steps of
determining whether or not said electrolyte ion concentration is within said normal range, in accordance with said estimated value of said electrolyte ion concentration provided by said step of estimating, and
decreasing an absolute value of at least one of a first electric power and a second electric power able to be continuously input and output to and from said secondary battery over a predetermined time, as compared with that when said electrolyte ion concentration is within the normal range, in limiting the charging/discharging by setting said first and said second electric powers, when it is determined that said electrolyte ion concentration is outside the normal range.

27. The method for controlling a secondary battery according to claim 15, wherein said predetermined material is lithium.

28. The method for controlling a secondary battery according to claim 15, wherein:
said secondary battery is mounted on an electrically powered vehicle, and
said load includes a motor for generating driving force for a wheel of said electrically powered vehicle.

* * * * *